(12) United States Patent
Tanaka et al.

(10) Patent No.: US 11,333,443 B2
(45) Date of Patent: May 17, 2022

(54) LOOP HEAT PIPE

(71) Applicant: Shinko Electric Industries Co., LTD., Nagano-ken (JP)

(72) Inventors: Koichi Tanaka, Nagano (JP); Nobuyuki Kurashima, Nagano (JP); Yoshihiro Machida, Nagano (JP); Takahiko Kiso, Nagano (JP)

(73) Assignee: Shinko Electric Industries Co., LTD., Nagano-ken (JP)

( * ) Notice: Subject to any disclaimer, the term of this patent is extended or adjusted under 35 U.S.C. 154(b) by 0 days.

(21) Appl. No.: 16/553,216

(22) Filed: Aug. 28, 2019

(65) Prior Publication Data

US 2020/0096261 A1   Mar. 26, 2020

(30) Foreign Application Priority Data

Sep. 25, 2018  (JP) .............................. JP2018-178528

(51) Int. Cl.
*F28D 15/02* (2006.01)
*F28D 15/04* (2006.01)
*H01L 23/427* (2006.01)

(52) U.S. Cl.
CPC ....... *F28D 15/0266* (2013.01); *F28D 15/043* (2013.01); *F28D 15/046* (2013.01); *H01L 23/427* (2013.01)

(58) Field of Classification Search
CPC .... F28D 15/02; F28D 15/0266; F28D 15/043; F28D 15/046; F28D 2021/0029; H01L 23/427
See application file for complete search history.

(56) References Cited

U.S. PATENT DOCUMENTS 3,786,861 A * 1/1974 Eggers .................. F28D 15/046
165/104.26
6,227,288 B1 5/2001 Gluck et al.
7,213,637 B2 * 5/2007 Lin ..................... F28D 15/0233
165/104.21

(Continued)

FOREIGN PATENT DOCUMENTS

EP       3299758 A1    3/2018
JP    2015-183880   * 10/2015

(Continued)

OTHER PUBLICATIONS

Machine Translation of JP 2015-183880; retrieved Sep. 22, 2020 (Year: 2020).*

(Continued)

*Primary Examiner* — Eric S Ruppert
*Assistant Examiner* — Hans R Weiland
(74) *Attorney, Agent, or Firm* — Wolf, Greenfield & Sacks, P.C.

(57) ABSTRACT

A loop heat pipe includes an evaporator that vaporizes working fluid, a condenser that liquefies the working fluid vaporized by the evaporator, a liquid pipe connecting the condenser to the evaporator, and a vapor pipe connecting the evaporator to the condenser. The liquid pipe includes two wall portions located at opposite sides of the liquid pipe, two porous bodies, each of which is continuous with and formed integrally with one of the two wall portions, and a flow passage located between the two porous bodies.

20 Claims, 22 Drawing Sheets

(56) References Cited

U.S. PATENT DOCUMENTS

| | | | |
|---|---|---|---|
| 2002/0195230 A1* | 12/2002 | Li | F28D 15/043 165/104.33 |
| 2005/0022978 A1* | 2/2005 | Duval | F28D 15/0233 165/104.26 |
| 2005/0230085 A1* | 10/2005 | Valenzuela | F28D 15/0233 165/104.26 |
| 2007/0056711 A1* | 3/2007 | Ohsawa | F28D 15/0233 165/104.21 |
| 2009/0323285 A1* | 12/2009 | Ryoson | H01L 23/427 361/700 |
| 2010/0263836 A1* | 10/2010 | Figus | F28D 15/043 165/104.26 |
| 2010/0307721 A1* | 12/2010 | Wang | F28D 15/0266 165/104.26 |
| 2010/0326632 A1* | 12/2010 | Nagai | F28F 3/086 165/104.26 |
| 2011/0120451 A1 | 5/2011 | Miles | |
| 2011/0192575 A1* | 8/2011 | Figus | F28D 15/043 165/104.26 |
| 2011/0209864 A1* | 9/2011 | Figus | F28D 15/0233 165/287 |
| 2012/0145358 A1* | 6/2012 | Moon | F28D 15/046 165/104.26 |
| 2014/0246176 A1* | 9/2014 | Yang | F28D 15/0266 165/104.26 |
| 2014/0290913 A1* | 10/2014 | Huang | F28D 15/0233 165/104.26 |
| 2015/0119111 A1* | 4/2015 | Honmura | F28D 15/046 455/566 |
| 2016/0259383 A1* | 9/2016 | Shioga | G06F 1/203 |
| 2018/0142960 A1 | 5/2018 | Kurashima et al. | |
| 2018/0177077 A1* | 6/2018 | Shioga | F28D 15/046 |
| 2019/0090386 A1* | 3/2019 | Shioga | H01L 23/427 |
| 2019/0316848 A1* | 10/2019 | Tseng | F28D 15/046 |

FOREIGN PATENT DOCUMENTS

| | | |
|---|---|---|
| JP | 2015-183880 A | 10/2015 |
| JP | 6146484 B2 | 6/2017 |

OTHER PUBLICATIONS

Extended European Search Report in connection with European Application No. 19194262.2 dated Feb. 6, 2020.

* cited by examiner

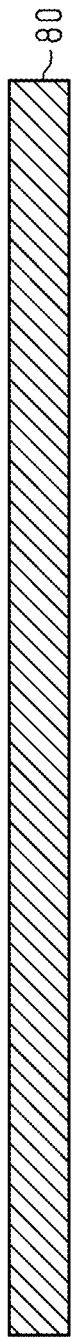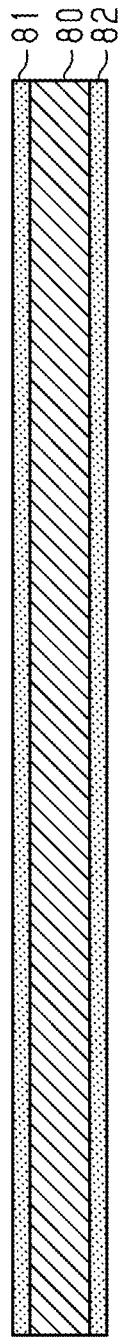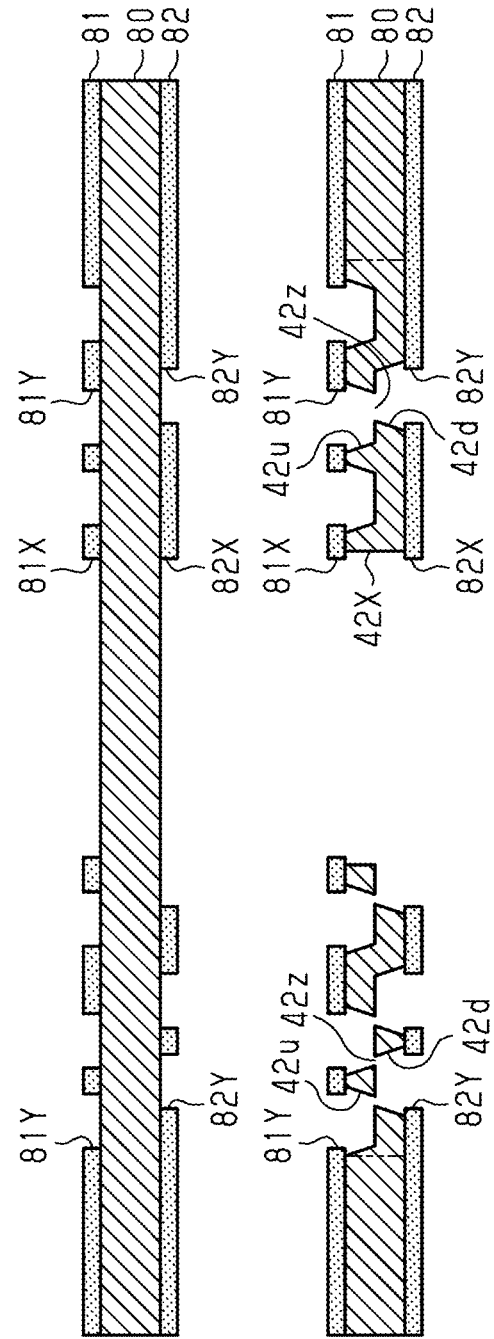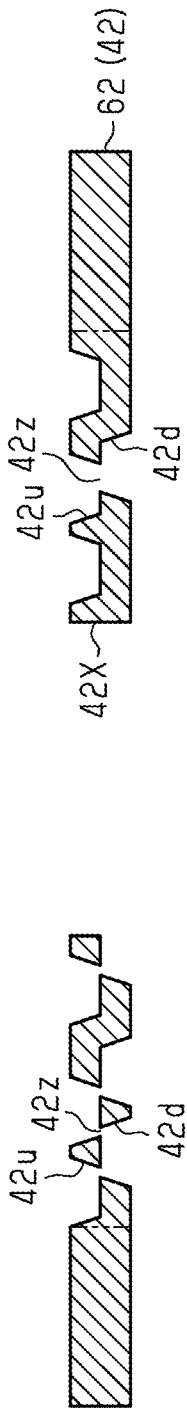

LOOP HEAT PIPE

CROSS-REFERENCE TO RELATED APPLICATIONS

This application is based upon and claims the benefit of priority from prior Japanese Patent Application No. 2018-178528, filed on Sep. 25, 2018, the entire contents of which are incorporated herein by reference.

FIELD

This disclosure relates to a loop heat pipe.

BACKGROUND

There is a heat pipe that transfers heat using phase transition of a working fluid to cool a heat-generating component of a semiconductor device (e.g., CPU) mounted on an electronic device. Japanese Patent No. 6146484 describes an example of a loop heat pipe.

A loop heat pipe includes an evaporator, which receives heat from a heat-generating body (heat-generating component) to vaporize a liquid-phase working fluid, and a condenser, which removes heat from the gas-phase working fluid to condense the working fluid. The loop heat pipe further includes a vapor pipe, which allows the working fluid that is changed into a gaseous phase by the evaporator to flow to the condenser, and a liquid pipe, which allows the working fluid that is changed into a liquid phase by the condenser to flow to the evaporator. The loop heat pipe has a loop structure that connects the evaporator, the vapor pipe, the condenser, and the liquid pipe in series and encloses the working fluid.

SUMMARY

In a heat pipe, flow of the working fluid affects the heat transfer efficiency. To increase the heat transfer efficiency, it is desirable that pressure loss of a flow passage through which the working fluid flows be reduced.

An embodiment of the present disclosure is a loop heat pipe. The loop heat pipe includes an evaporator that vaporizes working fluid, a condenser that liquefies the working fluid vaporized by the evaporator, a liquid pipe connecting the condenser to the evaporator, and a vapor pipe connecting the evaporator to the condenser. The liquid pipe includes two wall portions located at opposite sides of the liquid pipe, two porous bodies, each of which is continuous with and formed integrally with one of the two wall portions, and a flow passage located between the two porous bodies.

Other embodiments and advantages thereof will become apparent from the following description, taken in conjunction with the accompanying drawings, illustrating by way of example the principles of the invention.

It is to be understood that both the foregoing general description and the following detailed description are exemplary and explanatory and are not restrictive of the invention, as claimed.

BRIEF DESCRIPTION OF THE DRAWINGS

The embodiments, together with objects and advantages thereof, may best be understood by reference to the following description of the presently preferred embodiments together with the accompanying drawings in which:

FIGS. 6A to 6E are schematic cross-sectional views illustrating the procedures for manufacturing the intermediate metal layer illustrated in FIG. 5;

DESCRIPTION OF THE EMBODIMENTS

Figure 1:
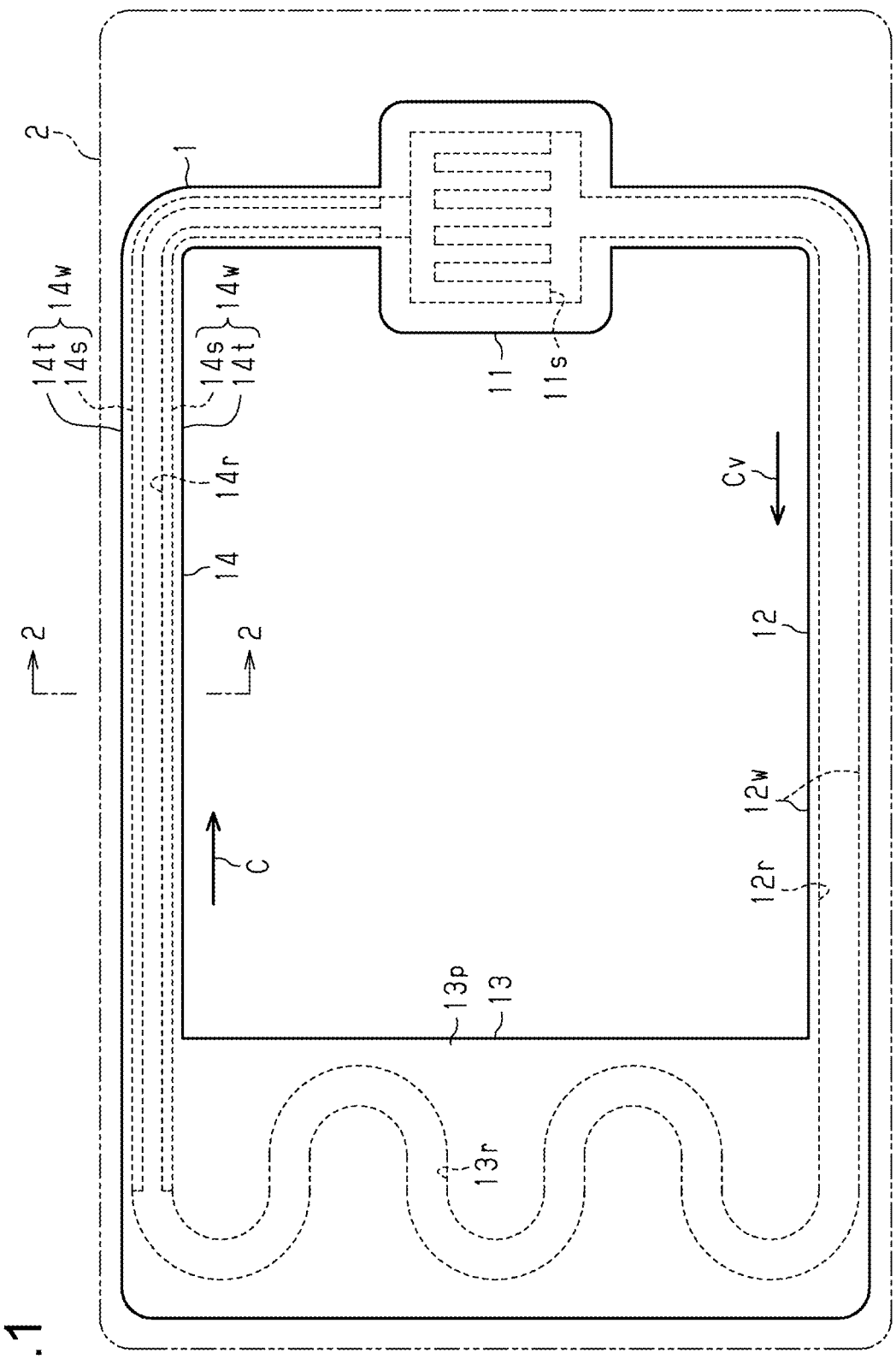
FIG. 1 is a schematic plan view of a loop heat pipe.

Embodiments will now be described with reference to the drawings. Elements in the drawings may be partially enlarged for simplicity and clarity and thus have not necessarily been drawn to scale. Moreover, to facilitate understanding, hatching lines may not be illustrated or be replaced by shadings in the cross-sectional drawings. In the present specification, "plan view" refers to a view of a subject taken in a vertical direction (for example, upper-lower direction in FIG. 2), and "planar shape" refers to a shape of a subject taken in the vertical direction.

Loop Heat Pipe Construction

As illustrated in FIG. 1, a loop heat pipe 1 is, for example, accommodated in a mobile electronic device 2 such as a smartphone or a tablet terminal.

The loop heat pipe 1 includes an evaporator 11, a vapor pipe 12, a condenser 13, and a liquid pipe 14.

The vapor pipe 12 connects the evaporator 11 to the condenser 13. The liquid pipe 14 connects the condenser 13 to the evaporator 11. The evaporator 11 vaporizes a working fluid C and generates a vapor Cv. The condenser 13 liquefies the vapor Cv of the working fluid C. The working fluid C liquefied by the condenser 13 is sent through the liquid pipe 14 to the evaporator 11. The evaporator 11, the vapor pipe 12, the condenser 13, and the liquid pipe 14 form a looped flow passage through which the working fluid C or the vapor Cv flows.

In the present embodiment the liquid pipe 14 and the vapor pipe 12 are, for example, equal in length. However, the liquid pipe 14 and the vapor pipe 12 may have different lengths. For example, the vapor pipe 12 may be shorter than the liquid pipe 14.

The evaporator 11 is in close contact with and fixed to a heat-generating component, which is not illustrated in the drawings. The evaporator 11 vaporizes the working fluid C to generate the vapor Cv with heat generated by the heat-generating component. Thermal interface material (TIM) may be arranged between the evaporator 11 and the heat-generating component. The thermal interface material reduces a thermal contact resistance between the heat-generating component and the evaporator 11 and smoothly transfers heat from the heat-generating component to the evaporator 11.

The vapor pipe 12 includes two pipe walls 12w located at opposite sides in the width-wise direction (vertical direction in FIG. 1) and a flow passage 12r located between the pipe walls 12w. The flow passage 12r is in communication with an inner cavity of the evaporator 11. The flow passage 12r is a portion of the loop flow passage described above. The vapor Cv generated in the evaporator 11 flows through the flow passage 12r of the vapor pipe 12 and is guided to the condenser 13.

The condenser 13 includes a heat dissipation plate 13p having a large area for heat dissipation and a flow passage 13r meandering through the heat dissipation plate 13p. The flow passage 13r is a portion of the loop flow passage described above. The condenser 13 liquefies the vapor Cv, which is guided via the vapor pipe 12 to the flow passage 13r.

The liquid pipe 14 includes two pipe walls 14w located at opposite sides in the width-wise direction (vertical direction in FIG. 1) and a flow passage 14r between the pipe walls 14w. The flow passage 14r is located at a substantially central portion of the liquid pipe 14 in the width-wise direction. The flow passage 14r is in communication with the flow passage 13r of the condenser 13 and the inner cavity of the evaporator 11. The flow passage 14r is a portion of the loop flow passage described above. The flow passage 14r allows the working fluid C to readily flow through the liquid pipe 14.

Each pipe wall 14w of the liquid pipe 14 includes a porous body 14s. The porous body 14s extends from the condenser 13 to the proximity of the evaporator 11 along the liquid pipe 14. The porous body 14s uses capillary force produced in the porous body 14s to guide the working fluid C liquefied by the condenser 13 to the evaporator 11.

The evaporator 11 includes a porous body 11s. The porous body 11s of the evaporator 11 is, for example, shaped as comb teeth. The evaporator 11 includes a void region, which does not include the porous body 11s. The number of comb teeth may be appropriately determined.

The loop heat pipe 1 transfers heat generated in the heat-generating component from the evaporator 11 to the condenser 13 and dissipates the heat from the condenser 13. Consequently, the loop heat pipe 1 cools the heat-generating component.

Preferably, fluid having a high vapor pressure and a high latent heat of vaporization is used as the working fluid C. The use of such a working fluid C efficiently cools the heat-generating component with the latent heat of vaporization. Examples of the working fluid C include ammonia, water, chlorofluorocarbon, alcohol, and acetone.

Figure 2:
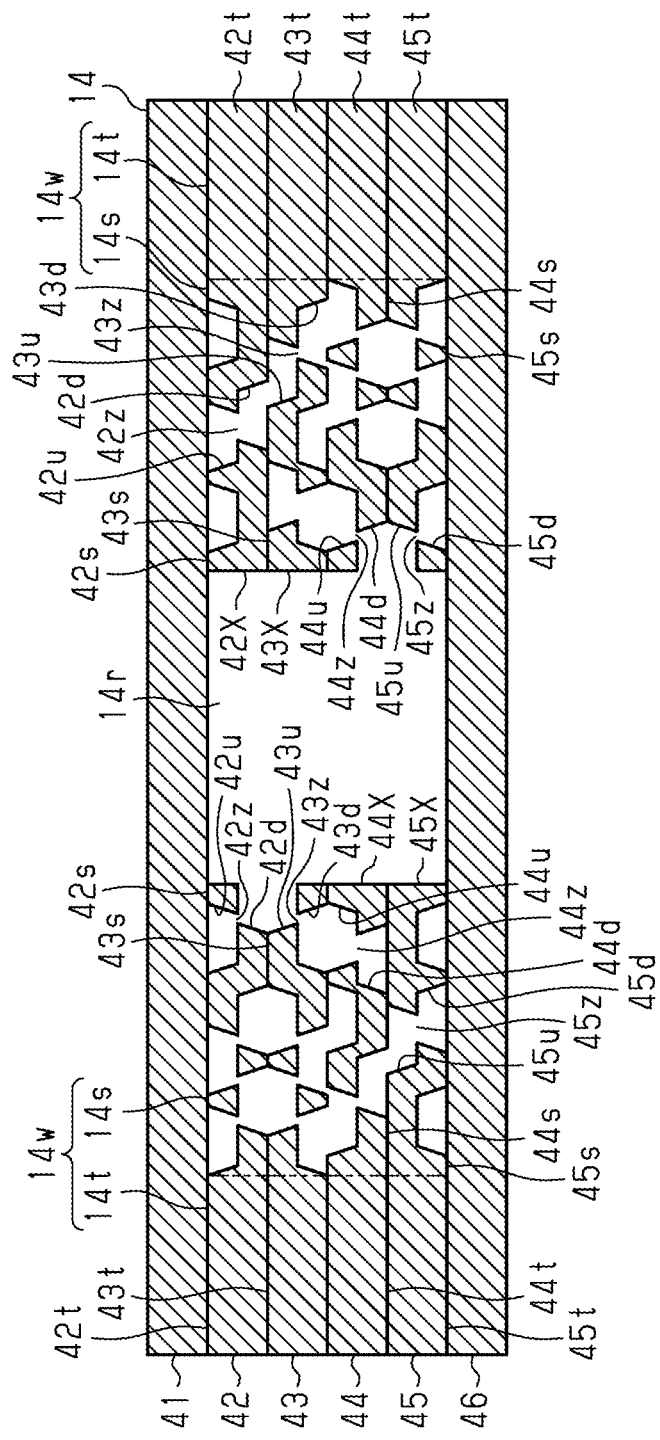
FIG. 2 is a schematic cross-sectional view of a liquid pipe taken along line 2-2 in FIG. 1.

FIG. 2 is a cross-sectional view of the liquid pipe 14 taken along line 2-2 illustrated in FIG. 1. The cross section illustrates a plane of the liquid pipe 14 that is orthogonal to the direction in which the working fluid C flows (direction indicated by arrows in FIG. 1).

As illustrated in FIG. 2, the liquid pipe 14 may be a stack of six metal layers 41 to 46. In the example illustrated in FIG. 2, the metal layers 42 to 45 are intermediate metal layers and stacked between the metal layers 41 and 46, which are two outermost metal layers. The metal layers 41 to 46 are, for example, copper layers having superior thermal conductance and directly bonded with each other through solid-phase bonding or the like. In FIG. 2, the metal layers 41 to 46 are separated from each other by solid lines to facilitate recognition of the metal layers 41 to 46. However, when integrating the metal layers 41 to 46 through, for example, diffusion bonding, the interfaces of the metal layers 41 to 46 will be eliminated, and the boundaries of the metal layers 41 to 46 may be unclear.

The metal layers 41 to 46 are not limited to copper layers and may be stainless steel layers, aluminum layers, or magnesium alloy layers. One or more of the metal layers 41 to 46 may be formed from a material that differs from the material of the remaining metal layers. The thickness of each of the metal layers 41 to 46 may be, for example, approximately 50 μm to 200 μm. The thickness of one or more of the metal layers 41 to 46 may differ from the thickness of the remaining metal layers. Alternatively, the metal layers 41 to 46 may differ in thickness from each other.

In the same manner as the liquid pipe 14 illustrated in FIG. 2, the evaporator 11, the vapor pipe 12, and the condenser 13, which are illustrated in FIG. 1, may be formed by stacking the six metal layers 41 to 46. That is, the loop heat pipe 1 illustrated in FIG. 1 may be formed by stacking the six metal layers 41 to 46. The number of stacked metal layers is not limited to six and may be five or less or seven or more.

As illustrated in FIG. 2, as described above, the liquid pipe 14 formed by the stack of the metal layers 41 to 46 includes the two pipe walls 14w and the flow passage 14r located between the pipe walls 14w. The pipe walls 14w are located at opposite sides of the liquid pipe 14 in a direction orthogonal to the stacking direction of the metal layers 41 to 46. The flow passage 14r is formed by through holes 42X to 45X that extend through the metal layers 42 to 45 (intermediate metal layers) in the thickness-wise direction.

Each of the pipe walls 14w integrally includes the porous body 14s. In the present example, each of the two pipe walls 14w includes the porous body 14s defining the flow passage 14r (forming one of the opposite walls of the flow passage 14r) and a wall portion 14t that is in contact with the porous body 14s. In each of the pipe walls 14w, the porous body 14s and the wall portion 14t are integrally formed by the metal layers 42 to 45 (intermediate metal layers). For example, each porous body 14s is continuous with and formed integrally with the corresponding one of the wall portions 14t.

Each of the porous bodies 14s includes porous bodies 42s to 45s formed in the respective metal layers 42 to 45 (intermediate metal layers). Each of the wall portions 14t further includes wall portions 42t to 45t formed in the respective metal layers 42 to 45. In the present embodiment, the metal layers 41 and 46 (outermost metal layers) do not include holes and grooves.

The metal layer 42 includes the through hole 42X extending through the metal layer 42 in the thickness-wise direction, the porous bodies 42s located at an outer side of the through hole 42X, and the wall portions 42t located at an outer side of the respective porous bodies 42s. In the present example, the porous body 42s is continuous with and formed integrally with the wall portion 42t. In the same manner, the metal layer 43 includes the through hole 43X extending through the metal layer 43 in the thickness-wise direction, the porous bodies 43s located at an outer side of the through hole 43X, and the wall portions 43t located at an outer side of the respective porous bodies 43s. In the present example, the porous body 43s is continuous with and formed integrally with the wall portion 43t. In the same manner, the metal layer 44 includes the through hole 44X extending through the metal layer 44 in the thickness-wise direction, the porous bodies 44s located at an outer side of the through hole 44X, and the wall portions 44t located at an outer side of the respective porous bodies 44s. In the present example, the porous body 44s is continuous with and formed integrally with the wall portion 44t. In the same manner, the metal layer 45 includes the through hole 45X extending through the metal layer 45 in the thickness-wise direction, the porous bodies 45s located at an outer side of the through hole 45X, and the wall portions 45t located at an outer side of the respective porous bodies 45s. In the present example, the porous body 45s is continuous with and formed integrally with the wall portion 45t.

The metal layers 42 to 45 are stacked so that the through holes 42X to 45X overlap with each other. The metal layer 41 is stacked on the upper surface of the metal layer 42, and the metal layer 46 is stacked on the lower surface of the metal layer 45. The metal layers 41 to 46 and the through holes 42X to 45X in the metal layers 42 to 45 define the flow passage 14r. The flow passage 14r is surrounded by the two porous body 14s and the metal layers 41 and 46.

As illustrated in FIG. 2, each porous body 42s includes bottomed holes 42u recessed from the upper surface of the metal layer 42 to a substantially central portion in the thickness-wise direction and bottomed holes 42d recessed from the lower surface of the metal layer 42 to a substantially central portion in the thickness-wise direction.

Figure 3:
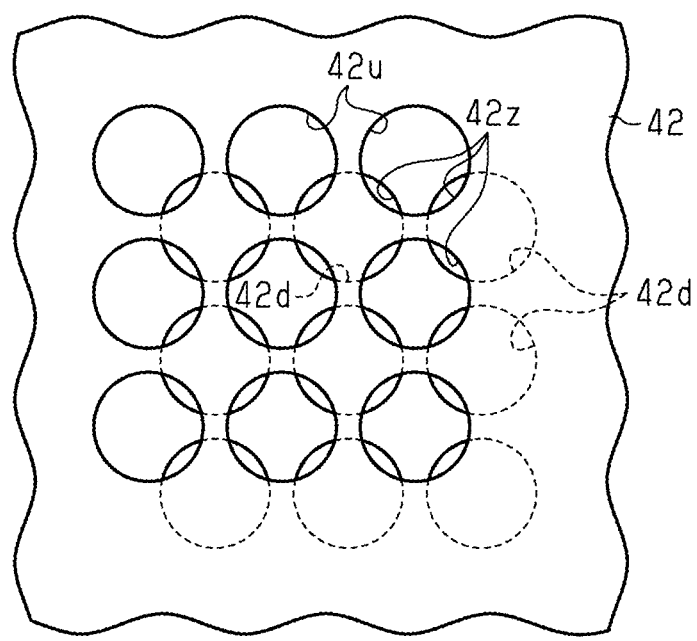
FIG. 3 is a schematic plan view partially illustrating a metal layer including a porous body.

As illustrated in FIG. 3, each of the bottomed holes 42u and 42d is circular in plan view and may have a diameter of 100 μm to 400 μm. However, each of the bottomed holes 42u and 42d may have any planar shape and may be, for example, elliptical or polygonal. The cross-sectional shape (wall surface) of each of the bottomed holes 42u and 42d may be tapered so that the size of the opening is reduced from the open end (upper surface or lower surface of the metal layer 42) toward the bottom (toward the central portion of the metal layer 42 in the thickness-wise direction).

However, the cross-sectional shape of the bottomed holes 42u and 42d is not limited to such a configuration and may be, for example, straight such that the wall surface of each bottomed hole is orthogonal to the bottom. Alternatively, the cross-sectional shape of each of the bottomed holes 42u and 42d may be any other recessed shape, for example, a substantially semicircular shape or a substantially semi-elliptical shape (for example, refer to FIG. 16). The substantially semicircular shape is not limited to a bisection of a true circle and includes a shape having an arc that is longer or shorter than the arc of a semicircle. The substantially semi-elliptical shape is not limited to a semi-ellipse, or a bisection of an ellipse, and includes a shape having an arc that is longer or shorter than the arc of a semi-ellipse. The bottomed holes 42u and 42d may each be shaped so that the wall surface and the bottom surface are continuously arcuate.

As illustrated in FIGS. 2 and 3, the bottomed holes 42u and the bottomed holes 42d partially overlap (are in communication) with each other in plan view to form fine pores 42z. FIG. 3 illustrates the layout of the bottomed holes 42u and 42d and the fine pores 42z, which are formed by the bottomed holes 42u and 42d partially overlapping with each other. The fine pores 42z may be formed by partial overlaps of the bottomed holes 42u and 42d having any cross-sectional shape and any planar shape described above. The porous body 42s including the bottomed holes 42u and 42d and the fine pores 42z configure a portion of the porous body 14s. The through hole 42X is adjacent to the two porous bodies 42s and is in communication with the bottomed holes 42u, the bottomed holes 42d, or both of the bottomed holes 42u and the bottomed holes 42d. In the example illustrated in FIG. 2, the through hole 42X is in communication with the bottomed holes 42d. The two wall portions 42t of the metal layer 42 do not include holes and grooves.

In the same manner, as illustrated in FIG. 2, the porous body 43s includes bottomed holes 43u recessed from the upper surface of the metal layer 43 to a substantially central portion in the thickness-wise direction and bottomed holes 43d recessed from the lower surface of the metal layer 43 to a substantially central portion in the thickness-wise direction. The bottomed holes 43u and 43d may have the same shape as the bottomed holes 42u and 42d in the metal layer 42. The bottomed holes 43u and 43d partially overlap (are in communication) with each other in plan view to form fine pores 43z. The porous body 43s including the bottomed holes 43u and 43d and the fine pores 43z configure a portion of the porous body 14s. The through hole 43X is adjacent to the two porous bodies 43s and is in communication with the bottomed holes 43u, the bottomed holes 43d, or both of the bottomed holes 43u and the bottomed holes 43d. In the example illustrated in FIG. 2, the through hole 43X is in communication with the bottomed holes 43u. The two wall portions 43t of the metal layer 43 do not include holes and grooves.

In the same manner, as illustrated in FIG. 2, the porous body 44s includes bottomed holes 44u recessed from the upper surface of the metal layer 44 to a substantially central portion in the thickness-wise direction and bottomed holes 44d recessed from the lower surface of the metal layer 44 to a substantially central portion in the thickness-wise direction. The bottomed holes 44u and 44d may have the same shape as the bottomed holes 42u and 42d in the metal layer 42. The bottomed holes 44u and 44d partially overlap (are in communication) with each other in plan view to form fine pores 44z. The porous body 44s including the bottomed holes 44u and 44d and the fine pores 44z configure a portion of the porous body 14s. The through hole 44X is adjacent to the two porous bodies 44s and is in communication with the bottomed holes 44u, the bottomed holes 44d, or both of the bottomed holes 44u and the bottomed holes 44d. In the example illustrated in FIG. 2, the through hole 44X is in communication with the bottomed holes 44d. The two wall portions 44t of the metal layer 44 do not include holes and grooves.

In the same manner, as illustrated in FIG. 2, the porous body 45s includes bottomed holes 45u recessed from the upper surface of the metal layer 45 to a substantially central portion in the thickness-wise direction and bottomed holes 45d recessed from the lower surface of the metal layer 45 to a substantially central portion in the thickness-wise direction. The bottomed holes 45u and 45d may have the same shape as the bottomed holes 42u and 42d in the metal layer 42. The bottomed holes 45u and 45d partially overlap (are in communication) with each other in plan view to form fine pores 45z. The porous body 45s including the bottomed holes 45u and 45d and the fine pores 45z configure a portion of the porous body 14s. The through hole 45X is adjacent to the two porous bodies 45s and is in communication with the bottomed holes 45u, the bottomed holes 45d, or both of the bottomed holes 45u and the bottomed holes 45d. In the example illustrated in FIG. 2, the through hole 45X is in communication with the bottomed holes 45u. The two wall portions 45t of the metal layer 45 do not include holes and grooves.

The bottomed holes 43u to 45u and 43d to 45d may have the same layout as the bottomed holes 42u and 42d or may have different layouts. For example, the bottomed holes 42d and the bottomed holes 43u may be laid out to overlap with each other in plan view. Alternatively, for example, the bottomed holes 42d and the bottomed holes 43u may partially overlap (may be in communication) with each other in plan view to form fine pores. This relationship is applied to the relationship between the bottomed holes 43d and the bottomed holes 44u and the relationship between the bottomed holes 44d and the bottomed holes 45u.

Manufacturing Method

A method for manufacturing the loop heat pipe 1 will now be described.

Figure 4:
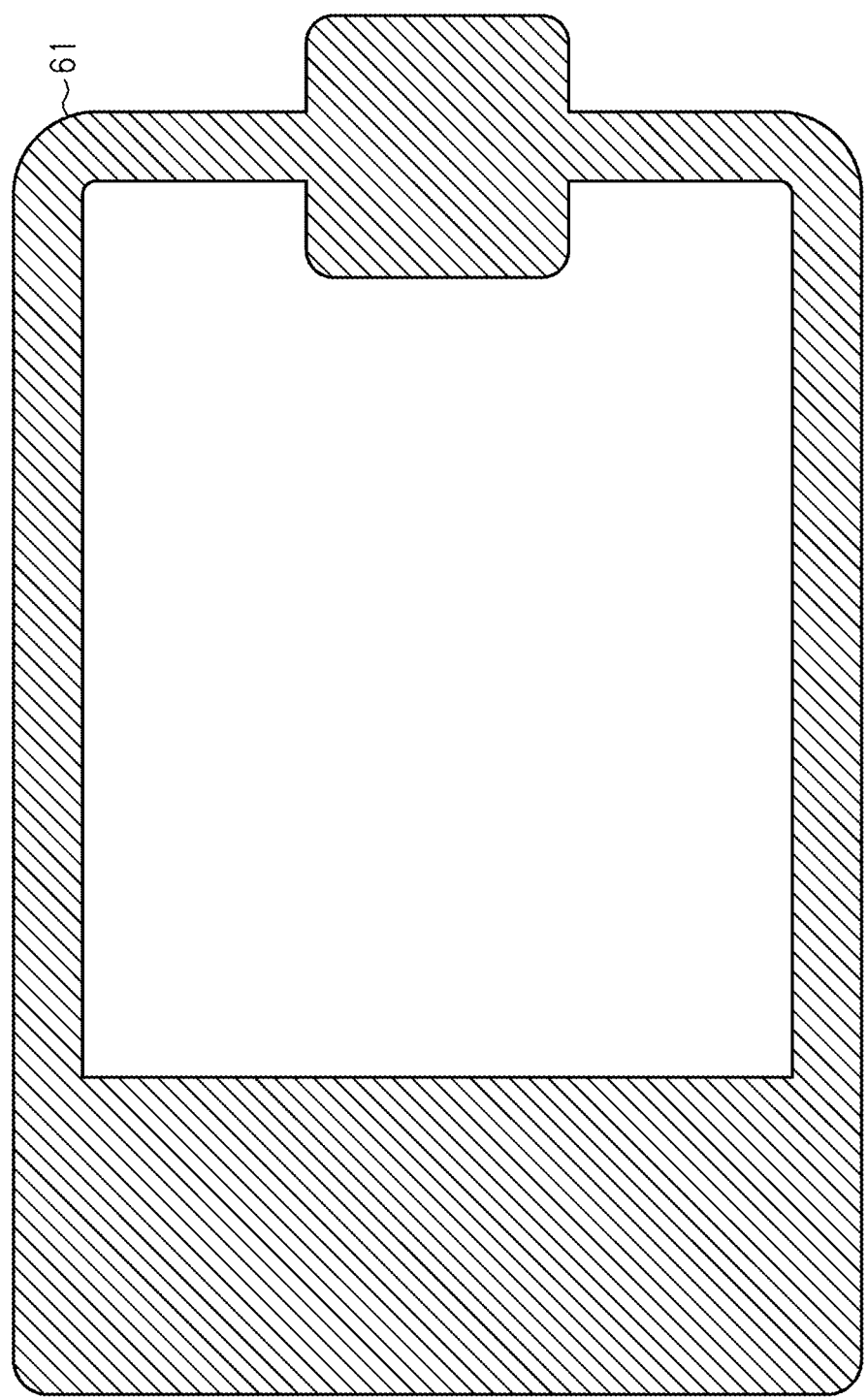
FIG. 4 is a schematic plan view of an outermost metal layer.
Figure 5:
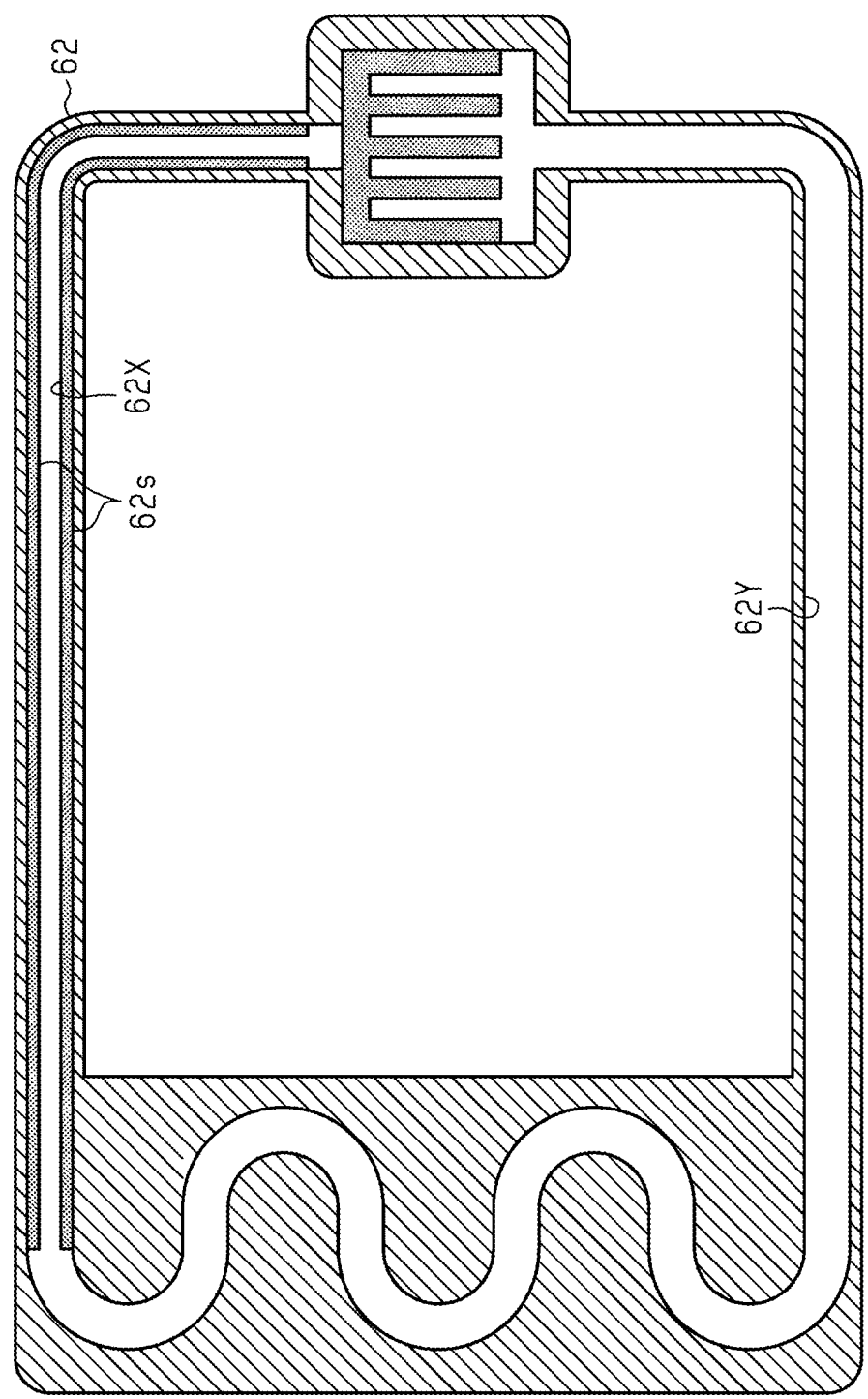
FIG. 5 is a schematic plan view of an intermediate metal layer.

FIG. 4 is a plan view illustrating one of the two outermost metal layers (uppermost metal layer and lowermost metal layer) of the loop heat pipe 1, and, in the present example, a metal layer 61 that is used as each of the metal layers 41 and 46 illustrated in FIG. 2. FIG. 5 is a plan view illustrating one or more intermediate metal layers of the loop heat pipe 1 stacked between the two outermost metal layers, and, in the present example, a metal layer 62 used as each of the metal layers 42 to 45 illustrated in FIG. 2.

Each of the metal layers 61 and 62 illustrated in FIGS. 4 and 5 is formed, for example, by patterning a copper layer having a thickness of 100 μm into a given shape through wet etching. The metal layer 61 illustrated FIG. 4 is a solid metal layer that does not include holes and grooves.

As illustrated in FIG. 5, the metal layer 62 includes an opening 62Y that conforms to the shape of the loop flow passage formed by the evaporator 11, the vapor pipe 12, the condenser 13, and the liquid pipe 14 illustrated in FIG. 1. Additionally, a through hole 62X corresponding to each of the through holes 42X to 45X illustrated in FIG. 2 extends through a portion of the metal layer 62 that corresponds to the liquid pipe 14. The metal layer 62 further includes a portion 62s corresponding to each of the porous bodies 42s to 45s illustrated in FIG. 2. The bottomed holes 42u and 42d to 45u and 45d (refer to FIG. 2) of the porous bodies 42s to 45s are formed in the portion 62s.

A method for forming the bottomed holes 42u and 42d of the porous body 42s and the through hole 42X for the flow passage 14r will now be described with reference to FIGS. 6A to 6E. Although the configuration of the metal layer 42 illustrated in FIG. 2 will be described as an example, the remaining metal layers 43 to 45 also have the same configuration.

FIGS. 6A to 6E are cross-sectional views illustrating steps of forming the bottomed holes 42u and 42d and the through hole 42X in a portion of the metal layer 62 (refer to FIG. 5) corresponding to the liquid pipe 14.

In the step illustrated in FIG. 6A, a flat metal sheet 80 is prepared. The metal sheet 80 is a member that ultimately becomes the metal layer 42 and may be formed from, for example, copper, stainless steel, aluminum, or a magnesium alloy. The thickness of the metal sheet 80 may be for example, approximately 50 μm to 200 μm.

In the step illustrated in FIG. 6B, a resist layer 81 is formed on the upper surface of the metal sheet 80, and a resist layer 82 is formed on the lower surface of the metal sheet 80. For example, a photosensitive dry film resist may be used as the resist layers 81 and 82.

In the step illustrated in FIG. 6C, the resist layer 81 undergoes exposure and development to form openings 81X and 81Y selectively exposing the upper surface of the metal sheet 80. In the same manner, the resist layer 82 undergoes exposure and development to form openings 82X and 82Y selectively exposing the lower surface of the metal sheet 80. For example, when forming the metal layer 42 illustrated in FIG. 2, the openings 81X and 82X are formed in the resist layers 81 and 82 in conformance with the shape and position of the through hole 42X illustrated in FIG. 2. The openings 81Y and 82Y are formed in the resist layers 81 and 82 in conformance with the shape and position of the bottomed holes 42u and 42d illustrated in FIG. 2.

In the step illustrated in FIG. 6D, the metal sheet 80 exposed in the openings 81X and 81Y is etched from an upper surface side of the metal sheet 80, and the metal sheet 80 exposed in the openings 82X and 82Y is etched from a lower surface side of the metal sheet 80. As a result, the through hole 42X is formed in a portion of the metal sheet 80 where the opening 81X overlaps with the opening 82X. Additionally, the bottomed holes 42u are formed in the upper surface side of the metal sheet 80 exposed in the opening 81Y, and the bottomed holes 42d are formed in the lower surface side of the metal sheet 80 exposed in the opening 82Y. The bottomed holes 42u and the bottomed holes 42d are partially in communication with each other in plan view and form the fine pores 42z. For example, a ferric chloride solution may be used to etch the metal sheet 80.

In the step illustrated in FIG. 6E, the resist layers 81 and 82 are removed with a stripping solution. The above steps form the metal layer 62 illustrated in FIG. 5 (the metal layer 42 illustrated in FIG. 2).

The same steps as the steps illustrated in FIGS. 6A to 6E are performed to form the metal layers 62 (refer to FIG. 5) used as the metal layers 43 to 45 illustrated in FIG. 2.

The solid metal layer 61 (refer to FIG. 4) that does not include holes and grooves is prepared.

Then, one or more intermediate metal layers (in the present example, the metal layers 42 to 45), each of which is formed by the metal layer 62 (refer to FIG. 5), are sandwiched between the uppermost metal layer and the lowermost metal layer (in the present example, the metal layers 41 and 46), each of which is formed by the metal layer 61 (refer to FIG. 4). As the metal layers 61 and 62 (the metal layers 41 to 46) are heated at a given temperature (for example, approximately 900° C.), the metal layers 61 and 62 (the metal layers 41 to 46) are pressed so that the metal layers 61 and 62 (the metal layers 41 to 46) are diffusion-bonded.

Subsequently, a vacuum pump (not illustrated) is used to remove the air from the liquid pipe 14, and the working fluid C (e.g., water) is added to the liquid pipe 14 from an inlet (not illustrated). When the inlet is closed, the loop heat pipe 1 is completed.

The present embodiment has the advantages described below.

(1) The loop heat pipe 1 includes the evaporator 11, which vaporizes the working fluid C to generate the vapor Cv, the condenser 13, which liquefies the vapor Cv, the vapor pipe 12, which allows the vaporized working fluid C (the vapor Cv) to flow into the condenser 13, and the liquid pipe 14, which allows the liquefied working fluid C to flow into the evaporator 11. The liquid pipe 14 includes the two wall portions 14t located at opposite sides of the liquid pipe 14, the two porous bodies 14s, each of which is continuous with and formed integrally with one of the wall portions 14t, and the flow passage 14r located between the porous bodies 14s. The liquid pipe 14 having such a configuration increases the cross-sectional area of the flow passage 14r while obtaining an increased cross-sectional area of the pipe walls 14w. The cross-sectional area of each pipe wall 14w includes the cross-sectional area of the wall portion 14t and the cross-sectional area of the porous body 14s (the cross-sectional area of the region including the porous body 14s). An increased cross-sectional area of the wall portions 14t increases the strength of the liquid pipe 14. An increased cross-sectional area of the porous body 14s increases the capillary force produced in the porous body 14s. The single flow passage 14r increases the cross-sectional area of the flow passage 14r and may reduce pressure loss of the working fluid C in the liquid pipe 14 as compared to a flow passage including multiple narrow flow passages. Thus, the heat transfer performance of the loop heat pipe 1 is improved.

(2) Each pipe wall 14w of the liquid pipe 14 includes the wall portion 14t and the porous body 14s provided integrally with the wall portion 14t. Thus, the pipe wall 14w is widened as compared to when the pipe wall 14w does not include the porous body 14s, that is, when the porous body 14s is disposed separate from the wall portion 14t. The pipe walls 14w having such a configuration limit crushing and deformation of the liquid pipe 14.

It should be apparent to those skilled in the art that the foregoing embodiments may be implemented in many other specific forms without departing from the scope of this disclosure. Particularly, it should be understood that the foregoing embodiments may be implemented in the following forms.

Modified examples of a liquid pipe will now be described.

In the modified examples, the same reference characters are given to those members that are the same as the corresponding members of the embodiment and those members that have the same configuration in the modified examples. Such members will not be described in detail. Elements other than the liquid pipe are the same as those of the embodiment (FIG. 1). Thus, drawings and description of the elements will not be provided while using FIG. 1 as reference.

Figure 7:
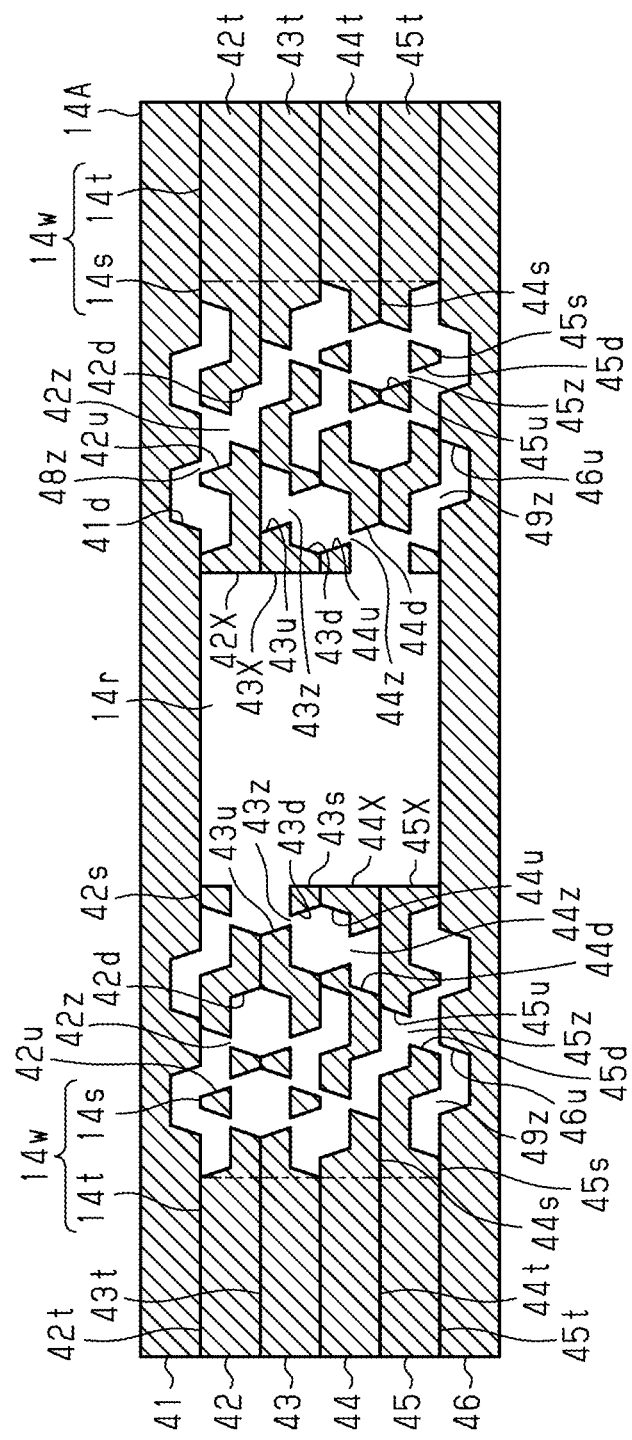
FIGS. 7 to 9 are schematic cross-sectional views illustrating various modified examples of liquid pipes.

FIG. 7 illustrates a liquid pipe 14A formed by a stack of the metal layers 41 to 46. The metal layers 42 to 45 of the liquid pipe 14A are formed in the same manner as the metal layers 42 to 45 of the liquid pipe 14 illustrated in FIG. 2.

The metal layer 41 (uppermost metal layer) has a lower surface that is in contact with the metal layer 42 (uppermost intermediate metal layer) and includes bottomed holes 41d recessed from the lower surface to a substantially central portion in the thickness-wise direction. The bottomed holes 41d in the metal layer 41 partially overlap with the bottomed holes 42u in the metal layer 42 in plan view. Thus, in the interface of the metal layers 41 and 42, the bottomed holes 41d and the bottomed holes 42u are partially in communication with each other and form fine pores 48z.

The metal layer 46 (lowermost metal layer) has an upper surface that is in contact with the metal layer 45 (lowermost intermediate metal layer) and includes bottomed holes 46u recessed from the upper surface to a substantially central portion in the thickness-wise direction. The bottomed holes 46u in the metal layer 46 partially overlap with the bottomed holes 45d in the metal layer 45 in plan view. Thus, in the interface of the metal layers 45 and 46, the bottomed holes 46u and the bottomed holes 45d are partially in communication with each other and form fine pores 49z.

The liquid pipe 14A includes the bottomed holes 41d and 46u in the uppermost metal layer 41 and the lowermost metal layer 46, respectively. This increases the cross-sectional area of the porous bodies 14s, thereby allowing movement of a greater amount of the working fluid C. The increased cross-sectional area of the porous bodies allows for further dispersion of the working fluid C.

Figure 8:
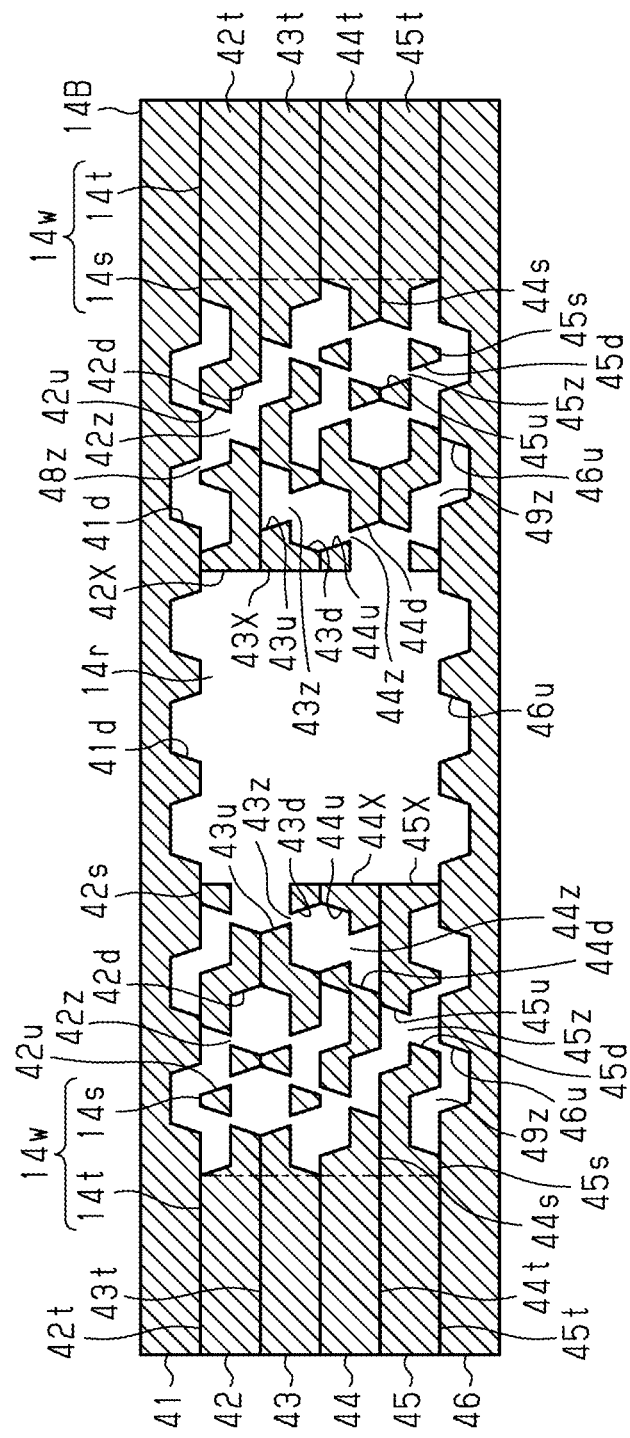

FIG. 8 illustrates a liquid pipe 14B formed by a stack of the metal layers 41 to 46. The metal layers 42 to 45 of the liquid pipe 14B have the same structure as those of the liquid pipe 14A illustrated in FIG. 7. In the liquid pipe 14B, in addition to the bottomed holes 41d and 46u illustrated in FIG. 7, the metal layers 41 and 46 includes bottomed holes 41d and 46u in positions overlapping with the flow passage 14r. Thus, the metal layer 41 includes the bottomed holes 41d that are in communication with the bottomed holes 42u in the metal layer 42 and the bottomed holes 41d that are in communication with the flow passage 14r. Also, the metal layer 46 includes the bottomed holes 46u that are in communication with the bottomed holes 45d in the metal layer 45 and the bottomed holes 46u that are in communication with the flow passage 14r.

Figure 9:
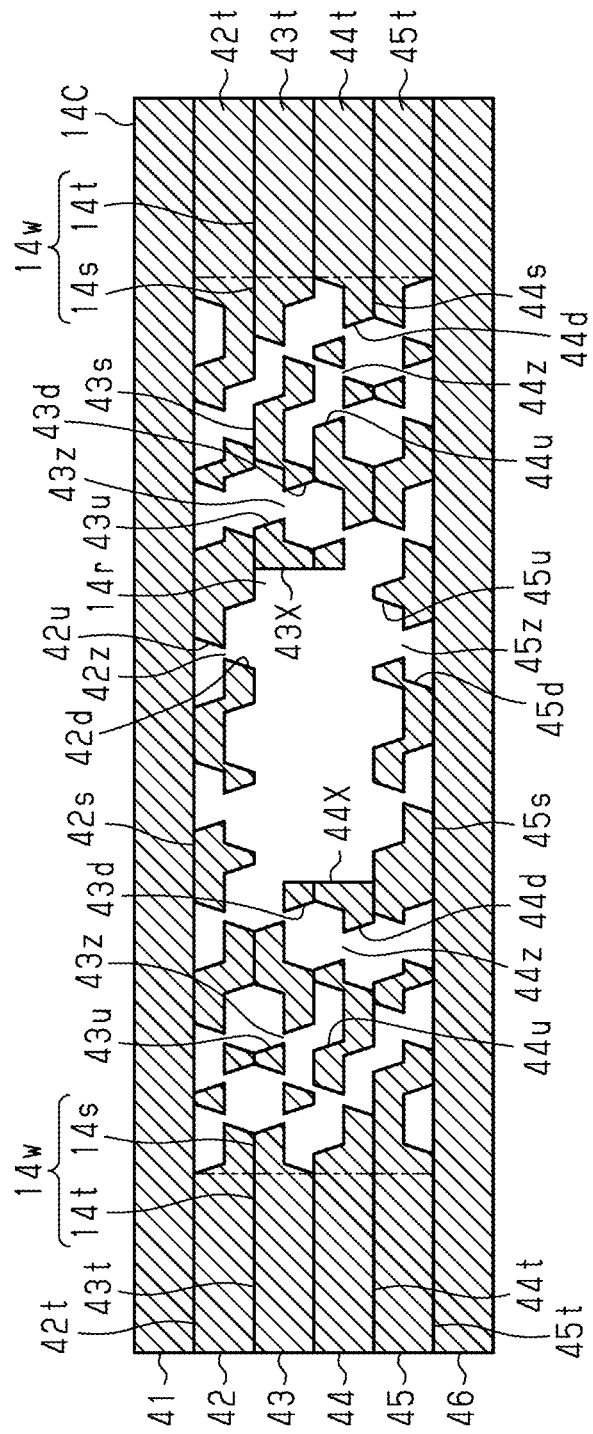

FIG. 9 illustrates a liquid pipe 14C formed by a stack of the metal layers 41 to 46.

The flow passage 14r of the liquid pipe 14C is formed by the through holes 43X and 44X extending through the metal layers 43 and 44 in the thickness-wise direction. Each pipe wall 14w of the liquid pipe 14C includes the porous body 14s and the wall portion 14t. The porous body 14s includes the porous body 43s of the metal layer 43 and the porous body 44s of the metal layer 44. The wall portion 14t includes the wall portion 43t of the metal layer 43 and the wall portion 44t of the metal layer 44.

The metal layer 43 includes the through hole 43X, which extends through a central portion corresponding to the position of the flow passage 14r in the thickness-wise direction, the two porous bodies 43s located at an outer side of the through hole 43X, and the two wall portions 43t located at an outer side of the respective porous bodies 43s. In the same manner, the metal layer 44 includes the through hole 44X, which extends through a central portion corresponding to the position of the flow passage 14r in the thickness-wise direction, the two porous bodies 44s located at an outer side of the through hole 44X, and the two wall portions 44t located at an outer side of the respective porous bodies 44s.

The metal layer 42 includes the two wall portions 42t, which overlap with the wall portions 43t of the metal layer 43, and the porous body 42s located between the wall portions 42t. The porous body 42s overlaps with the porous bodies 43s and 44s and the through holes 43X and 44X of the metal layers 43 and 44 in plan view. The porous body 42s includes the bottomed holes 42u recessed from the upper surface of the metal layer 42 to a substantially central portion in the thickness-wise direction, the bottomed holes 42d recessed from the lower surface of the metal layer 42 to a substantially central portion in the thickness-wise direction, and the fine pores 42z formed by the bottomed holes 42u and the bottomed holes 42d partially overlapping with each other.

In the same manner, the metal layer 45 includes the two wall portions 45t, which overlap with the wall portions 44t of the metal layer 44, and the porous body 45s located between the wall portions 45t. The porous body 45s overlaps with the porous bodies 43s and 44s and the through holes 43X and 44X of the metal layers 43 and 44 in plan view. The porous body 45s includes the bottomed holes 42u recessed from the upper surface of the metal layer 45 to a substantially central portion in the thickness-wise direction, the bottomed holes 45d recessed from the lower surface of the metal layer 45 to a substantially central portion in the thickness-wise direction, and the fine pores 45z formed by the bottomed holes 42u and the bottomed holes 45d partially overlapping with each other.

In the liquid pipe 14C illustrated in FIG. 9, one of the metal layers 42 and 45 may be changed to the metal layer 42 or the metal layer 45 illustrated in FIG. 2. The metal layers 41 and 46 of the liquid pipe 14C illustrated in FIG. 9 may be appropriately changed to the metal layers 41 and 46 illustrated in FIG. 7 or the metal layers 41 and 46 illustrated in FIG. 8 and further include the fine pores 48z and 49z.

Figure 10:
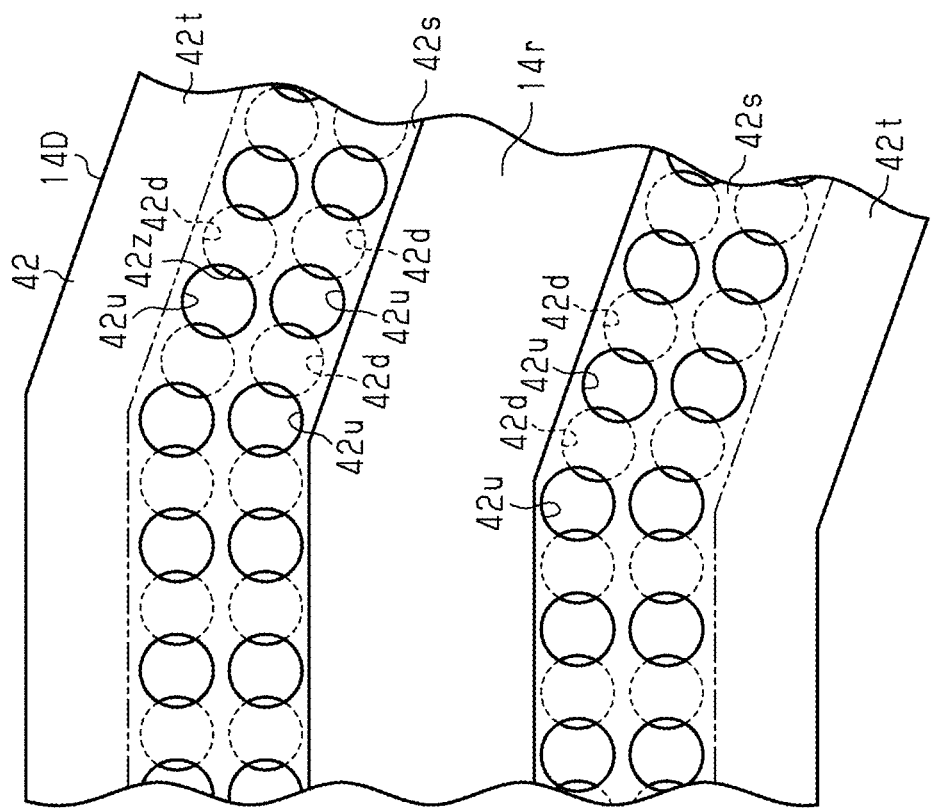
FIG. 10 is a schematic plan view illustrating a further modified example of a liquid pipe.

FIG. 10 is an enlarged view illustrating a portion of a liquid pipe 14D that is bent in plan view. The metal layer 42 of the liquid pipe 14D includes the bottomed holes 42u and 42d. The bottomed holes 42u and the bottomed holes 42d are alternately arranged along the bent liquid pipe 14D. Such a layout allows the working fluid C to move along the bent liquid pipe 14D. For example, in an orthogonally bent portion of the liquid pipe 14D (e.g., an upper right bent portion of the loop heat pipe 1 in FIG. 1), the working fluid C readily flows along the bent liquid pipe 14D. The porous bodies of the metal layers 43 to 45 and the flow passage may also be formed along the bent liquid pipe.

Figure 11:
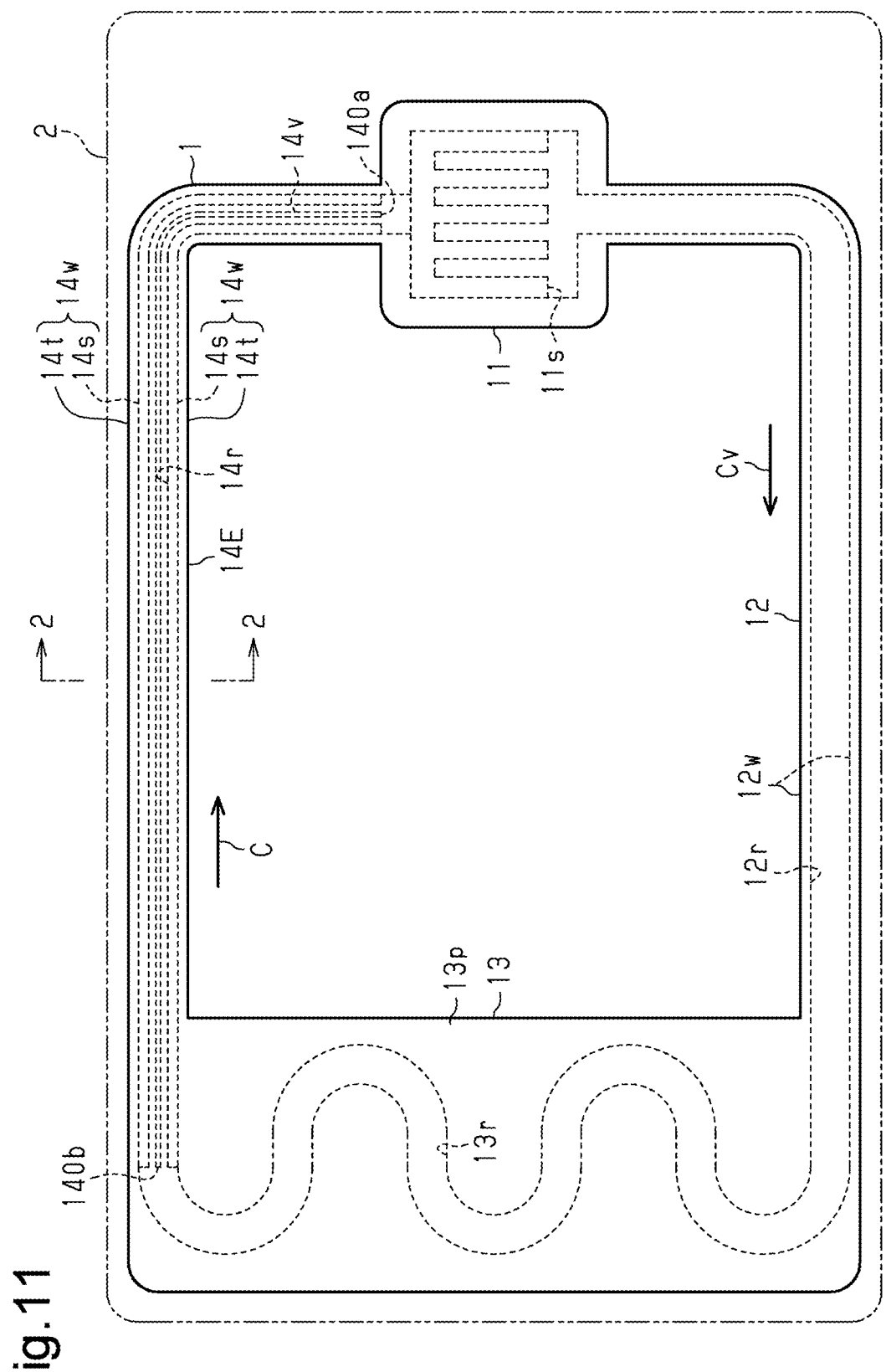
FIG. 11 is a schematic plan view illustrating another modified example of a loop heat pipe.
Figure 12:
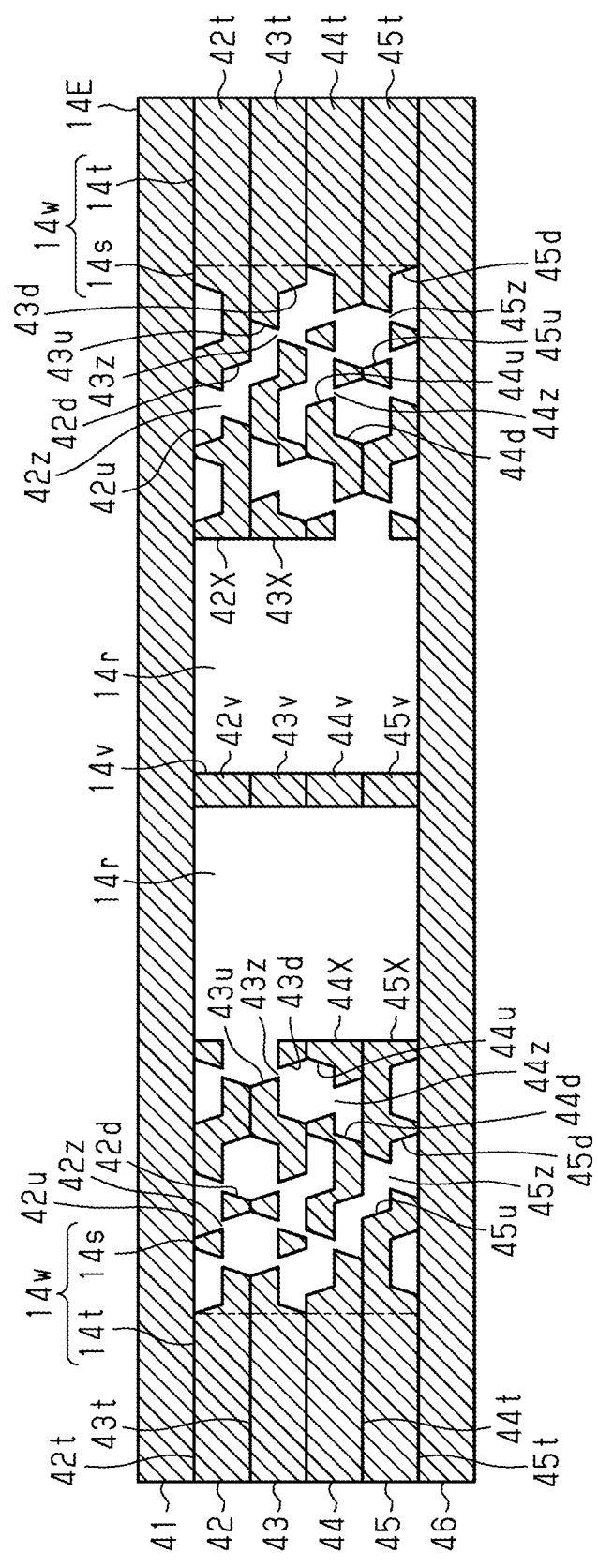
FIG. 12 is a schematic cross-sectional view illustrating the liquid pipe illustrated in FIG. 11.

FIG. 11 illustrates the loop heat pipe 1 including a liquid pipe 14E. As illustrated in FIG. 12, the liquid pipe 14E is formed of a stack of the metal layers 41 to 46. As in FIG. 2, each pipe wall 14w includes the porous body 14s defining the flow passage 14r and the wall portion 14t that is in contact with the porous body 14s. The porous body 14s is continuous with and formed integrally with the wall portion 14t.

The liquid pipe 14E further includes a post 14v in the center of the flow passage 14r. In other words, the post 14v of the liquid pipe 14E divides the flow passage 14r into two flow passage portions. The post 14v does not include holes and grooves. Also, the post 14v does not include a porous body such as the porous body 14s. The two flow passage portions of the flow passage 14r are completely divided by the post 14v. As illustrated in FIG. 11, the post 14v includes one end 140a located in the proximity of the evaporator 11, and the other end 140b of the post 14v is located in the proximity of the condenser 13. The end 140b may extend into the condenser 13.

The post 14v includes post portions 42v to 45v of the metal layers 42 to 45 and is located between the outermost metal layers 41 and 46. In the liquid pipe 14E, while obtaining an increased cross-sectional area of the flow passage 14r, the post 14v limits crushing of the liquid pipe 14E. If the post 14v includes a porous body and allows communication between the two flow passage portions of the flow passage 14r, which are located opposite (left and right) sides of the post 14v, the working fluid C would flow between the left and right flow passage portions through the post 14v. This adversely affects the heat transfer performance. However, in this modified example, the post 14v does not include a porous body, and the two flow passage portions of the flow passage 14r are independently arranged at opposite sides of the post 14v. This limits the adverse effect on the heat transfer performance of the liquid pipe 14E.

Figure 13:
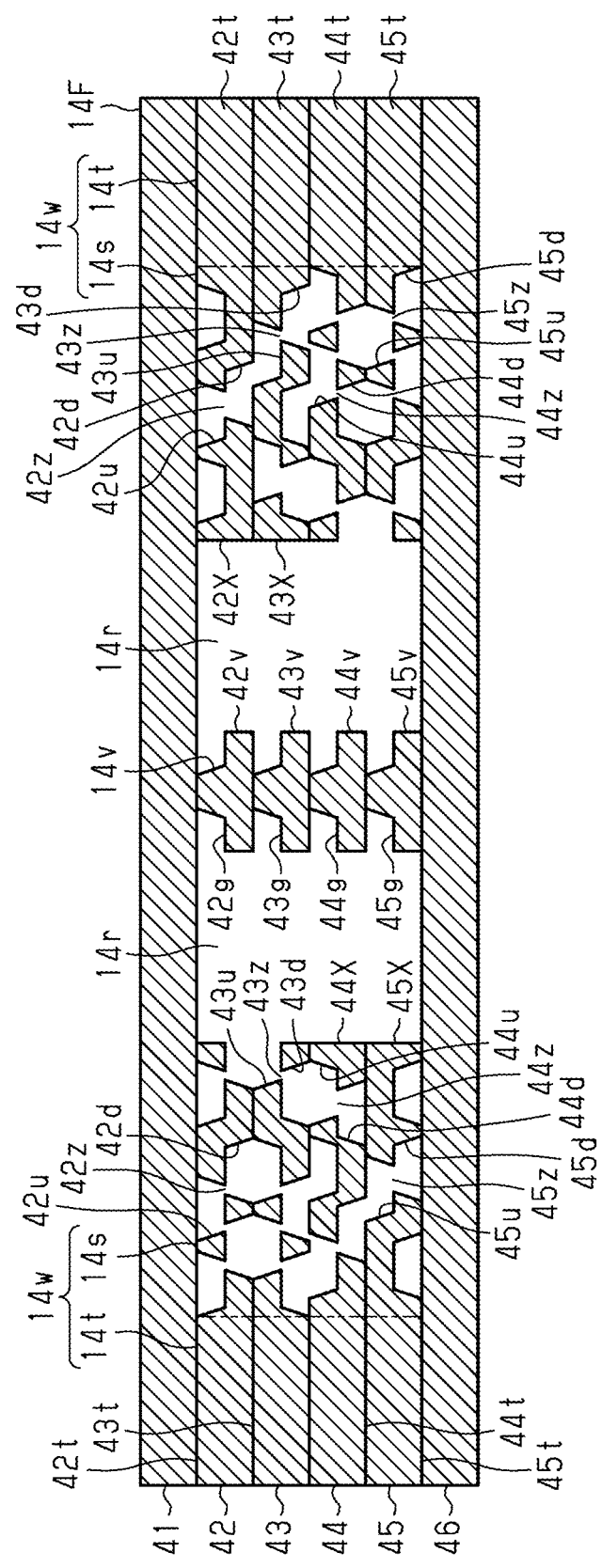
FIGS. 13 to 19 are schematic cross-sectional views illustrating various modified examples of liquid pipes.

FIG. 13 illustrates a liquid pipe 14F including another post 14v. The post 14v of the liquid pipe 14F differs from the post 14v illustrated in FIG. 12 in that the side surface of the post 14v includes grooves. The post 14v of the liquid pipe 14F is formed by the post portions 42v to 45v of the metal layers 42 to 45. The post portions 42v to 45v respectively include grooves 42g to 45g linearly extending along the liquid pipe 14F (in flow passage direction). The grooves 42g to 45g are formed, for example, by half-etching the post portions 42v to 45v from the upper surface side. The grooves 42g to 45g are in communication with the flow passage 14r and allow the working fluid C to smoothly flow in the flow passage 14r.

Figure 14:
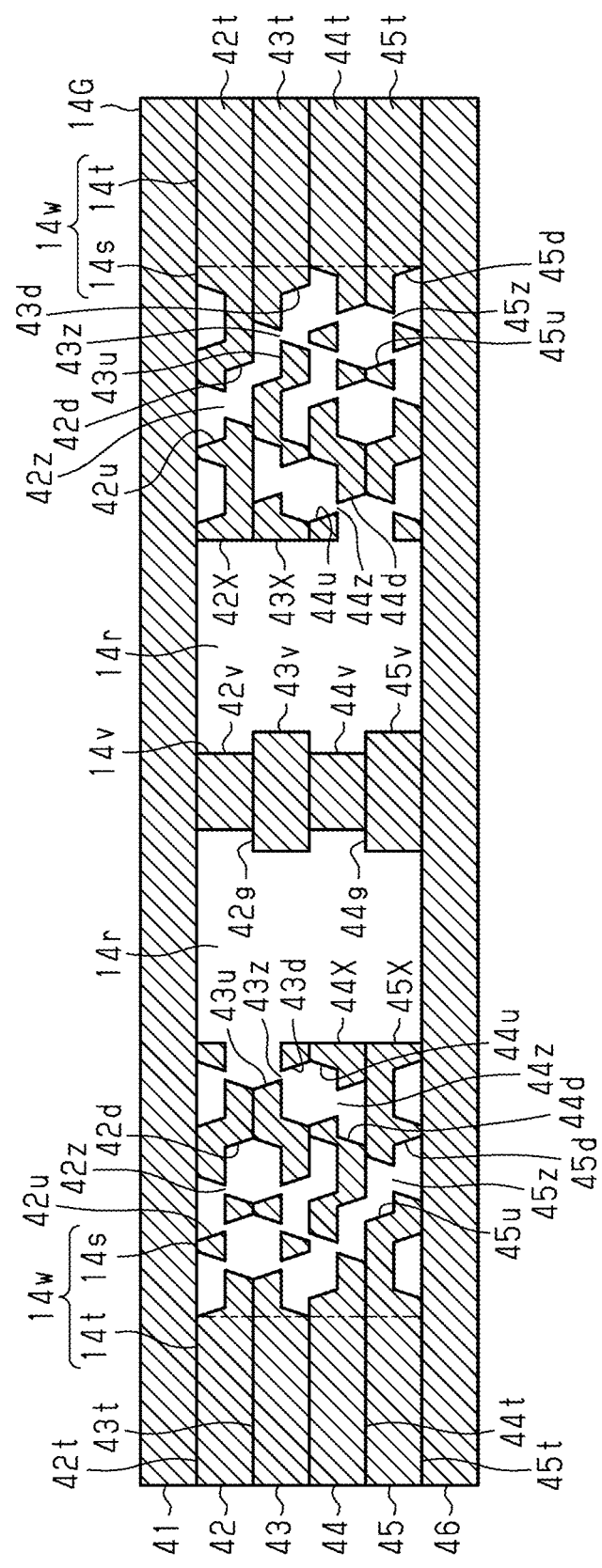

FIG. 14 illustrates a liquid pipe 14G including another post 14v. In the liquid pipe 14G, the side surface of the post 14v includes grooves 42g and 44g that differ from those of the post 14v illustrated in FIG. 13. In the same manner as the post 14v illustrated in FIG. 13, the post 14v of the liquid pipe 14G is formed by the post portions 42v to 45v of the metal layers 42 to 45. The grooves 42g and 44g are formed respectively in the post portions 42v and 44v and linearly extend along the liquid pipe 14G (in flow passage direction). In the modified example, the width of the post portions 42v and 44v is set to a smaller value than the width of the post portions 43v and 45v so that the grooves 42g and 44g are formed. In another modified example, the width of one or more of the post portions 42v to 45v may differ from the width of the remaining post portions. The grooves 42g and 44g are in communication with the flow passage 14r and allow the working fluid C to smoothly flow in the flow passage 14r.

Figure 15:
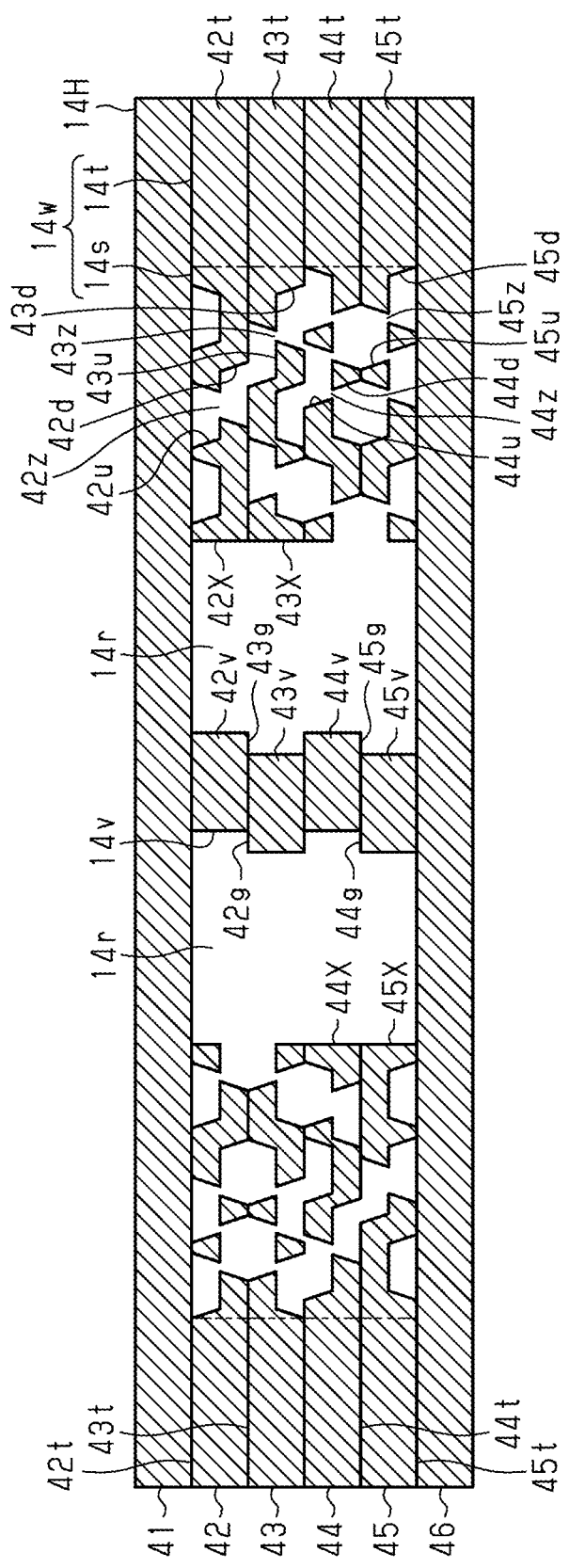

FIG. 15 illustrates a liquid pipe 14H including another post 14v. In the liquid pipe 14H, the side surface of the post 14v includes grooves 42g to 45g that differ from those of the post 14v illustrated in FIG. 14. As illustrated in FIG. 15, the grooves 42g to 45g are formed by staggering the post portions 42v to 45v in the width-wise direction of the liquid pipe 14H (sideward direction in the drawing).

Figure 16:
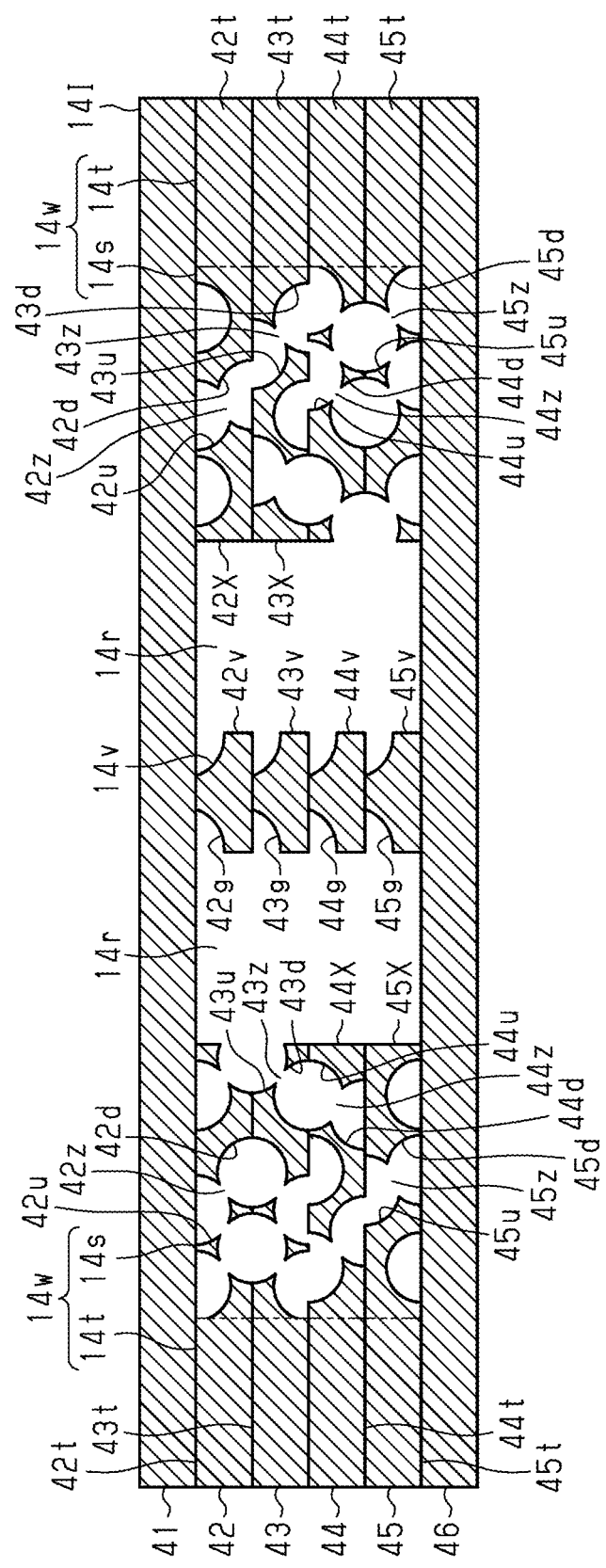

FIG. 16 illustrates a liquid pipe 14I including another post 14v. In the liquid pipe 14I, the side surface of the post 14v includes grooves 42g to 45g that differ from those of the post 14v illustrated in FIG. 13. The grooves 42g to 45g linearly extend along the liquid pipe 14I (in flow passage direction). Each of the grooves 42g to 45g has an arcuate cross-section and is formed by, for example, half-etching the post portions 42v to 45v from the upper surface. The grooves 42g to 45g are in communication with the flow passage 14r and allow the working fluid C to smoothly flow in the flow passage 14r.

Figure 17:
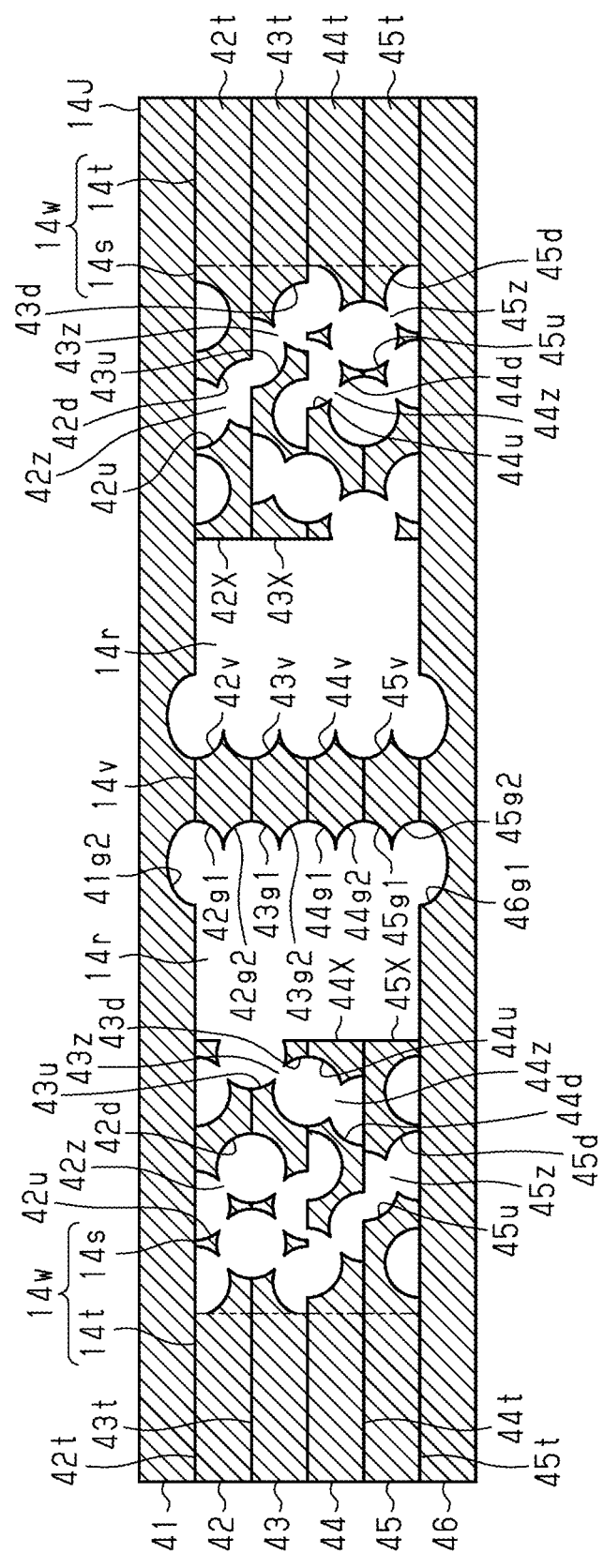

FIG. 17 illustrates a liquid pipe 14J including another post 14v. In the liquid pipe 14J, the side surface of the post 14v includes grooves 42g1 to 45g1 and 42g2 to 45g2 that differ from those of the post 14v illustrated in FIG. 16. In this modified example, the metal layer 41 includes grooves 41g2, and the metal layer 46 includes grooves 46g1. The grooves 41g2, 42g1 to 45g1, 42g2 to 45g2, and 46g1 linearly extend along the liquid pipe 14J (in flow passage direction).

The grooves 42g1 are formed by half-etching the post 42v of the metal layer 42 from the upper surface side. The grooves 42g2 are formed by half-etching the post 42v of the metal layer 42 from the lower surface side. In the same manner, the grooves 43g1 are formed by half-etching the post 43v of the metal layer 43 from the upper surface side. The grooves 43g2 are formed by half-etching the post 43v of the metal layer 43 from the lower surface side. In the same manner, the grooves 44g1 are formed by half-etching the post 44v of the metal layer 44 from the upper surface side. The grooves 44g2 are formed by half-etching the post 44v of the metal layer 44 from the lower surface side. In the same manner, the grooves 45g1 are formed by half-etching the post 45v of the metal layer 45 from the upper surface side. The grooves 45g2 are formed by half-etching the post 45v of the metal layer 45 from the lower surface side. In the same manner, the grooves 41g2 are formed by half-etching the outermost metal layer 41 from the lower surface side. In the same manner, the grooves 46g1 are formed by half-etching the outermost metal layer 46 from the upper surface side. The grooves 41g2, 42g1 to 45g1, 42g2 to 45g2, and 46g1 are in communication with the flow passage 14r and allow the working fluid C to smoothly flow in the flow passage 14r.

Figure 18:
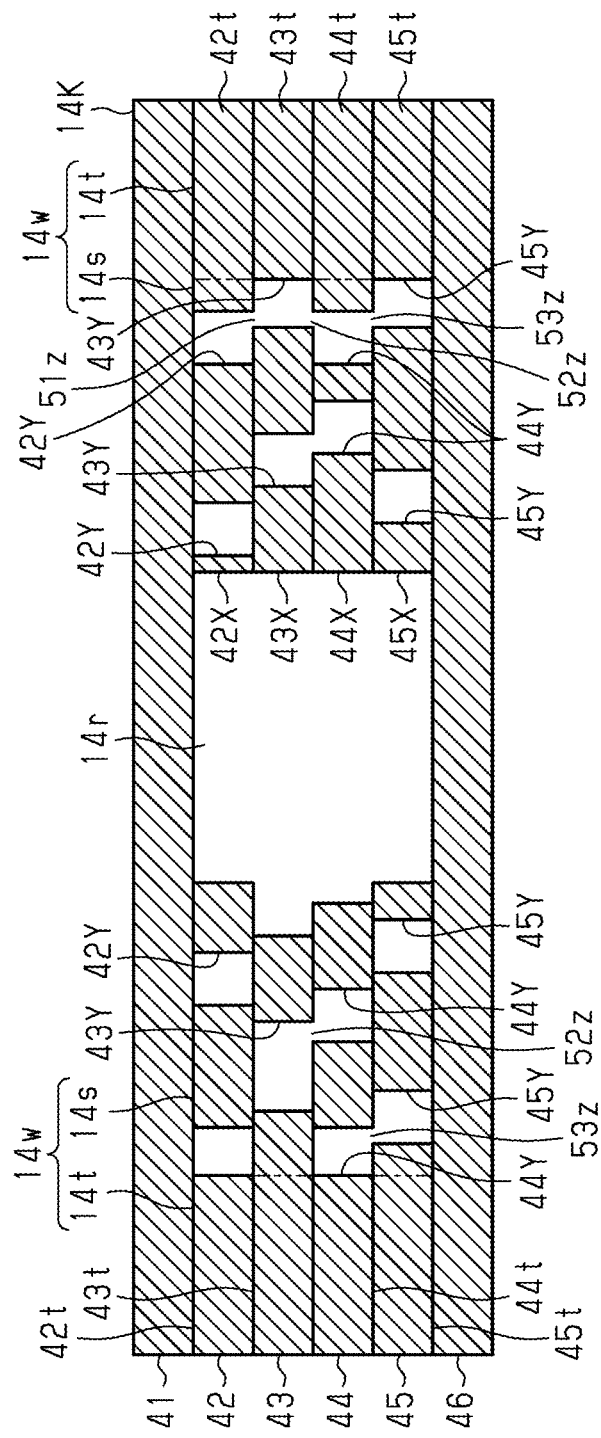

FIG. 18 illustrates a liquid pipe 14K formed by a stack of the metal layers 41 to 46. As in FIG. 2, each pipe wall 14w includes the porous body 14s defining the flow passage 14r and the wall portion 14t that is in contact with the porous body 14s. The porous body 14s is continuous with and formed integrally with the wall portion 14t. The porous body 14s includes through holes 42Y, 43Y, 44Y, and 45Y extending through the metal layers 42, 43, 44, and 45 in the thickness-wise direction. Each of the through holes 42Y to 45Y is, for example, circular in plan view. The through holes 42Y and the through holes 43Y partially overlap (are in communication) with each other to form fine pores 51z. In the same manner, the through holes 43Y and the through holes 44Y partially overlap (are in communication) with each other to form fine pores 52z. In the same manner, the through holes 44Y and the through holes 45Y partially overlap (are in communication) with each other to form fine pores 53z.

Figure 19:
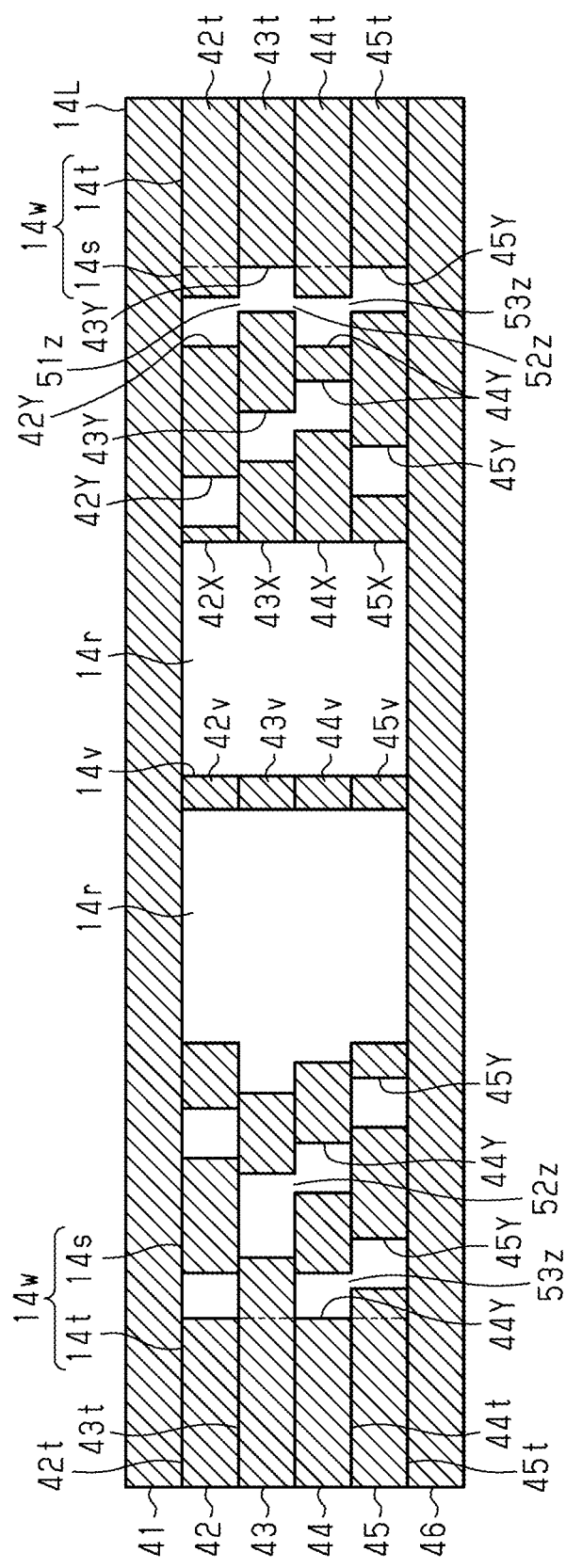

FIG. 19 illustrates a liquid pipe 14L including the same post 14v as in FIG. 12. The liquid pipe 14L is the same as the liquid pipe 14K illustrated in FIG. 18 except that the post 14v is located in the center of the flow passage 14r. The post 14v illustrated in FIG. 19 may be replaced with any one of the posts 14v illustrated in FIGS. 13 to 17.

Figure 20A:
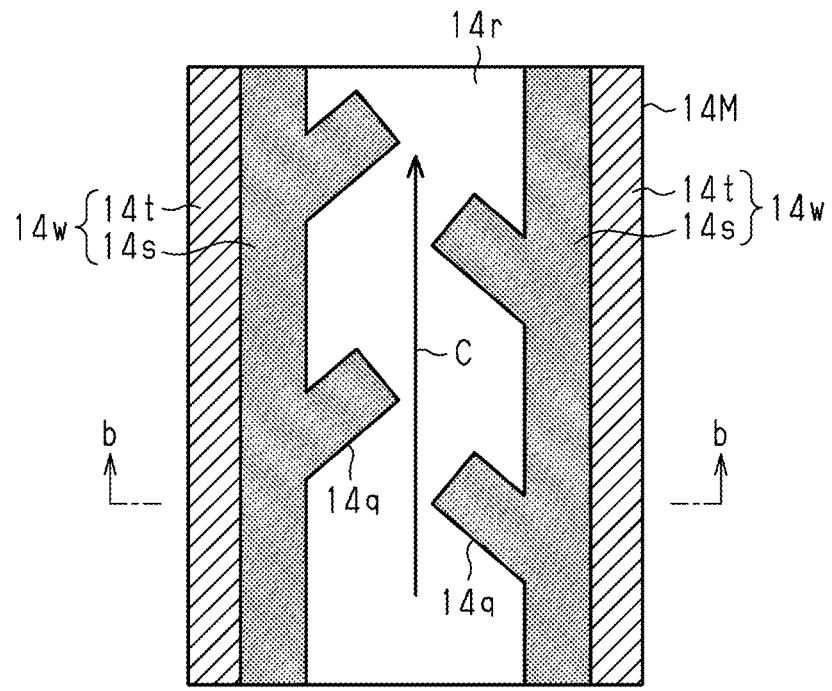
FIG. 20A is a schematic plan view illustrating another modified example of a liquid pipe.
Figure 20B:
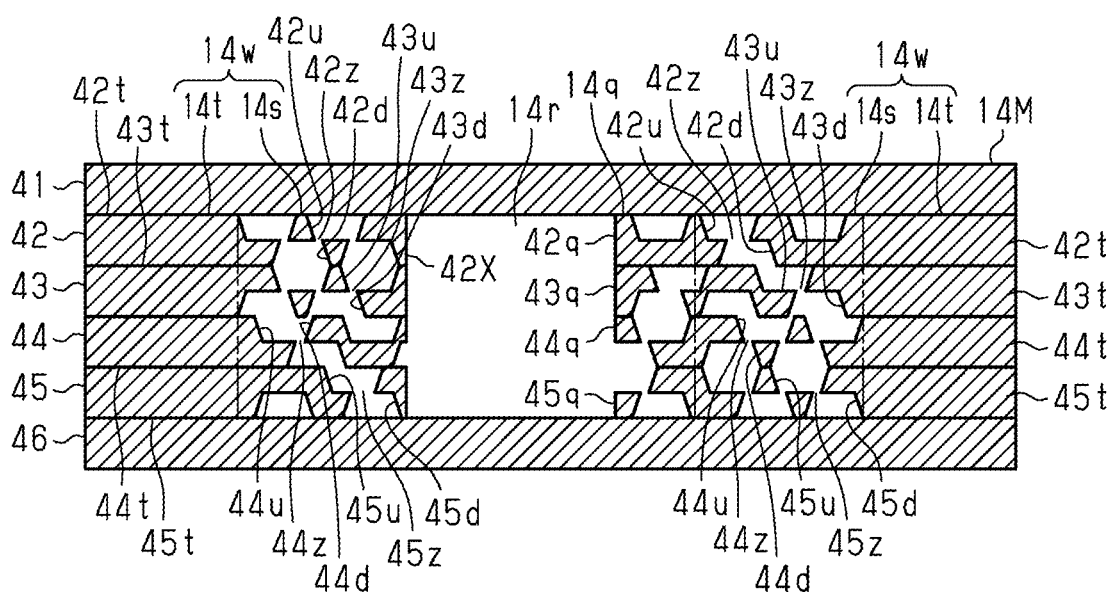
FIG. 20B is a cross-sectional view taken along line b-b in FIG. 20A.

FIGS. 20A and 20B each illustrate a liquid pipe 14M formed by a stack of the metal layers 41 to 46. As in FIG. 2, each pipe wall 14w includes the porous body 14s defining the flow passage 14r and the wall portion 14t that is in contact with the porous body 14s. The porous body 14s is continuous with and formed integrally with the wall portion 14t. The pipe wall 14w further includes projections 14q that are continuous with and formed integrally with the porous body 14s and project from the porous body 14s toward the flow passage 14r. Each projection 14q obliquely extends from the porous body 14s of the corresponding one of the pipe walls 14w toward the downstream side (upward in FIG. 20A) of the flow passage 14r, through which the working fluid C flows. The projections 14q are partially arranged on the pipe walls 14w (the porous bodies 14s). The projections 14q are formed by, for example, porous bodies in the same manner as the porous bodies 14s of the pipe walls 14w.

In the present example, the projections 14q include porous bodies 42q of the metal layer 42, porous bodies 43q of the metal layer 43, porous bodies 44q of the metal layer 44, and porous bodies 45q of the metal layer 45.

In the same manner as the porous body 42s, each porous body 42q includes the bottomed holes 42u recessed from the upper surface of the metal layer 42 to a substantially central portion in the thickness-wise direction, the bottomed holes 42d recessed from the lower surface of the metal layer 42 to a substantially central portion in the thickness-wise direction, and the fine pores 42z formed by the bottomed holes 42u and the bottomed holes 42d partially overlapping with each other.

In the same manner as the porous body 43s, each porous body 43q includes the bottomed holes 43u recessed from the upper surface of the metal layer 43 to a substantially central portion in the thickness-wise direction, the bottomed holes 43d recessed from the lower surface of the metal layer 43 to a substantially central portion in the thickness-wise direction, and the fine pores 43z formed by the bottomed holes 43u and the bottomed holes 43d partially overlapping with each other.

In the same manner as the porous body 44s, each porous body 44q includes the bottomed holes 44u recessed from the upper surface of the metal layer 44 to a substantially central portion in the thickness-wise direction, the bottomed holes 44d recessed from the lower surface of the metal layer 44 to a substantially central portion in the thickness-wise direction, and the fine pores 44z formed by the bottomed holes 44u and the bottomed holes 44d partially overlapping with each other.

In the same manner as the porous body 45s, each porous body 45q includes the bottomed holes 45u recessed from the upper surface of the metal layer 45 to a substantially central portion in the thickness-wise direction, the bottomed holes 45d recessed from the lower surface of the metal layer 45 to a substantially central portion in the thickness-wise direction, and the fine pores 45z formed by the bottomed holes 45u and the bottomed holes 45d partially overlapping with each other.

In this modified example, the projections 14q are formed by porous bodies. However, the projections 14q may be formed of something other than porous bodies.

The projections 14q effectively limit back flow of the working fluid C. Thus, when the loop heat pipe 1 includes the liquid pipe 14M and is used in the top heat mode, the heat transfer performance is improved. The top heat mode refers to a heat transferring mode in which the evaporator 11, which is heated by an external element (heat-generating component) to vaporize the working fluid C, is arranged at a higher position than the condenser 13, which dissipates heat to condense the vapor Cv of the working fluid C so that the heat is transferred from an upper side to a lower side. Additionally, the projections 14q limit crushing of the flow passage 14r of the liquid pipe 14M.

Other modified examples applicable to the embodiments and modified examples that are described above are as follows.

Figure 21A:
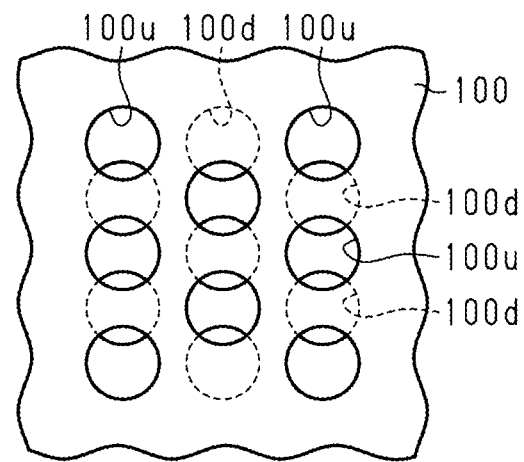
FIGS. 21A, 21B, and 22A are schematic plan views partially illustrating various modified examples of porous bodies.

FIG. 21A illustrates a metal layer 100 in which bottomed holes 100u and 100d are arranged. The bottomed holes 100u are formed in the upper surface of the metal layer 100. The bottomed holes 100d are formed in the lower surface of the metal layer 100. The bottomed holes 100u and the bottomed holes 100d are arranged in rows. The bottomed holes 100u and the bottomed holes 100d are alternately arranged in each row. Also, the bottomed holes 100u and the bottomed holes 100d are alternately arranged in a direction (sideward direction in FIG. 21A) orthogonal to the rows.

Figure 21B:
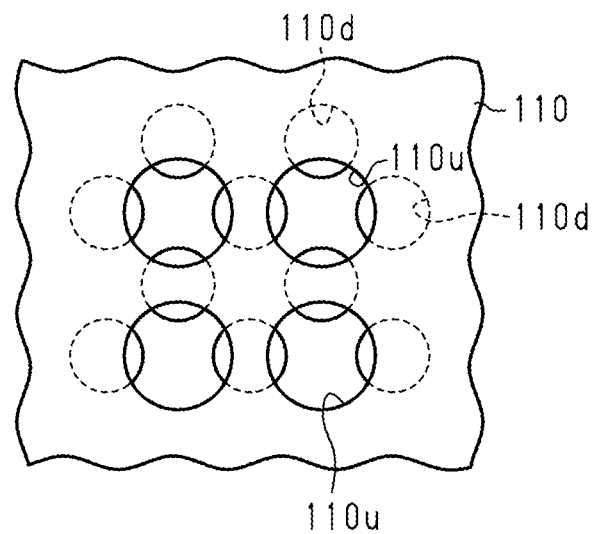

FIG. 21B illustrates a metal layer 110 in which bottomed holes 110u and 110d having different sizes are arranged. In FIG. 21B, the bottomed holes 110u formed in the upper surface of the metal layer 110 are larger than the bottomed holes 110d formed in the lower surface of the metal layer 110. The bottomed holes 110d may be larger than the bottomed holes 110u. Bottomed holes located adjacent to each other between two vertically adjacent metal layers may have different sizes. The layout of the bottomed holes 110u and 110d may be changed.

Figure 22A:
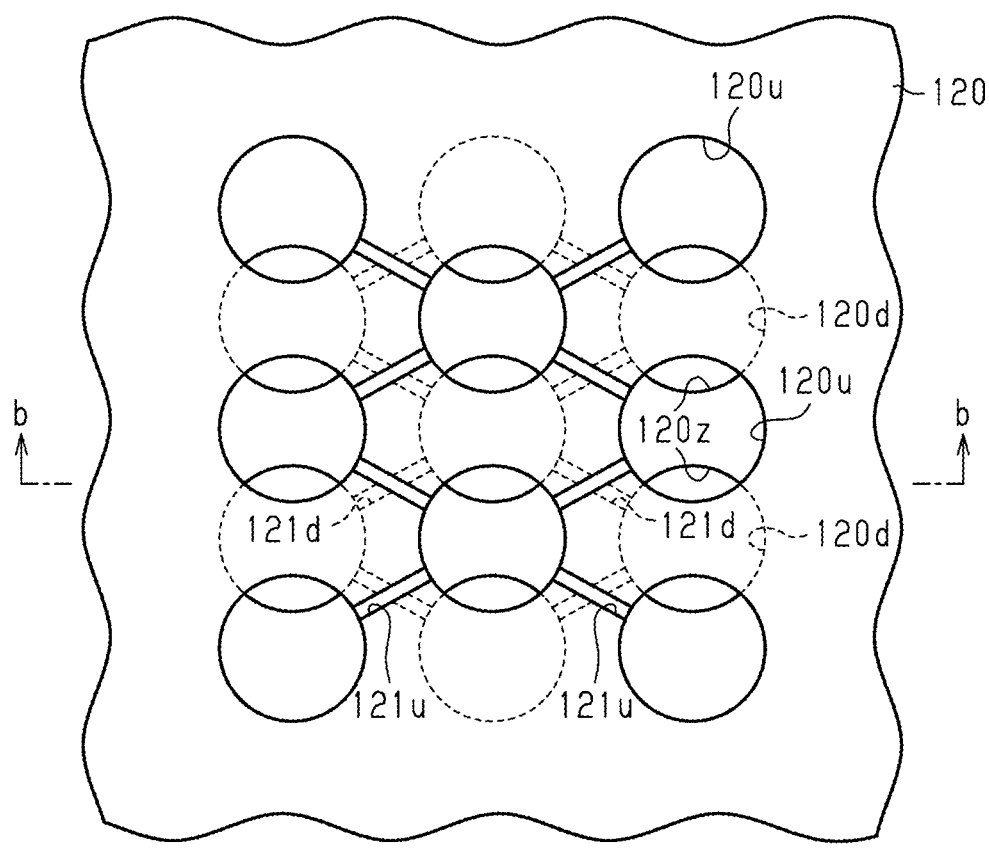
Figure 22B:
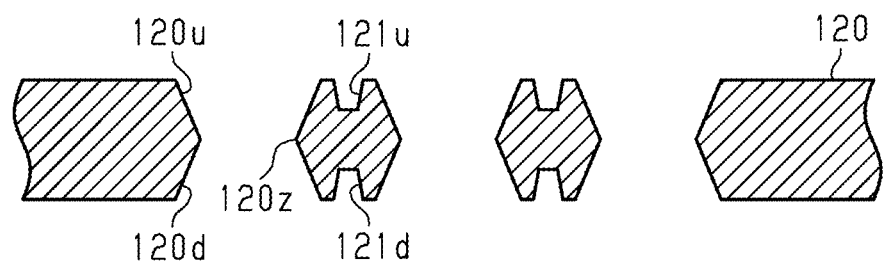
FIG. 22B is a cross-sectional view taken along line b-b in FIG. 22A.

FIGS. 22A and 22B each illustrate an example of a metal layer 120 that includes bottomed holes 120u and 120d and grooves 121u and 121d. FIG. 22B is a cross-sectional view taken along line b-b in FIG. 22A.

In the metal layer 120, the bottomed holes 120u are recessed from the upper surface of the metal layer 120 to a substantially central portion in the thickness-wise direction, and the bottomed holes 120d are recessed from the lower surface of the metal layer 120 to a substantially central portion in the thickness-wise direction. The bottomed holes 120u and the bottomed holes 120d are arranged in rows. The bottomed holes 120u and the bottomed holes 120d are alternately arranged in each row. The bottomed holes 120u and 120d that are alternately arranged in a direction in which the rows extend (vertical direction in FIG. 22A) partially overlap (are in communication) with each other to form fine pores 120z. Also, the bottomed holes 120u and the bottomed holes 120d are alternately arranged in a direction (sideward direction in FIG. 22A) orthogonal to the rows.

The upper surface of the metal layer 120 includes grooves 121u that allow communication between adjacent ones of the bottomed holes 120u. The lower surface of the metal layer 120 includes grooves 121d that allow communication between adjacent ones of the bottomed holes 120d.

The bottomed holes 120u and 120d that are alternately arranged in a direction in which the rows extend (vertical direction in FIG. 22B) allow the working fluid C to move in the direction in which the rows extend. The working fluid C moves between two of the bottomed holes 120u that are in communication with each other through the groove 121u formed in the upper surface of the metal layer 120. The working fluid C also moves between two of the bottomed holes 120d that are in communication with each other through the groove 121d formed in the lower surface of the metal layer 120. As described above, the grooves 121u (121d) allow movement of the working fluid C in directions other than the direction in which the bottomed holes 120u (120d) and the bottomed holes 120u (120d) are alternately arranged.

The grooves 121u and 121d may be formed in the metal layers 42 to 45 of the embodiments and modified examples that are described above. In the modified examples illustrated in FIGS. 7 and 8, the grooves 121u and 121d may be formed in at least one of the uppermost metal layer 41 and the lowermost metal layer 46.

In the embodiments and modified examples described above, the shape of the bottomed holes may be changed.

In the embodiments and modified examples described above, the depth of a bottomed hole located at the upper surface side may differ from the depth of a bottomed hole located at the lower surface side.

The embodiments and modified examples that are described above may be combined as long as the combined modifications remain technically consistent with each other.

All examples and conditional language recited herein are intended for pedagogical purposes to aid the reader in understanding the principles of the invention and the concepts contributed by the inventors to furthering the art, and are to be construed as being without limitation to such specifically recited examples and conditions, nor does the organization of such examples in the specification relate to an illustration of the superiority and inferiority of the invention. Although embodiments have been described in detail, it should be understood that various changes, substitutions, and alterations could be made hereto without departing from the scope of this disclosure.

The invention claimed is:

1. A loop heat pipe, comprising:
an evaporator that vaporizes working fluid;
a condenser that liquefies the working fluid vaporized by the evaporator;
a liquid pipe connecting the condenser to the evaporator; and
a vapor pipe connecting the evaporator to the condenser, wherein:
the evaporator, the vapor pipe, the condenser, and the liquid pipe form a looped flow passage through which the working fluid flows, and
the liquid pipe includes
two wall portions located at opposite sides of the liquid pipe,
two porous bodies, each of the two porous bodies being continuous with and formed integrally with one of the two wall portions, and
a flow passage that is a portion of the looped flow passage and located between the two porous bodies, wherein the two porous bodies form opposite walls of the flow passage, wherein the flow passage completely separates an entirety of the two porous bodies, and wherein a surface of the flow passage between the two porous bodies is free of porous bodies.

2. The loop heat pipe according to claim 1, wherein
the liquid pipe includes two outermost metal layers and one or more intermediate metal layers stacked between the two outermost metal layers,
the one or more intermediate metal layers include at least one first metal layer,
the first metal layer includes
two first wall portions forming the two wall portions,
two first porous bodies forming the two porous bodies, each of the two first porous bodies being continuous with and formed integrally with one of the two first wall portions, and
a first through hole extending through the first metal layer in a thickness-wise direction to form the flow passage between the two first porous bodies.

3. The loop heat pipe according to claim 2, wherein each of the two first porous bodies includes
a first bottomed hole recessed from a first surface of the first metal layer,
a second bottomed hole recessed from a second surface of the first metal layer, the second surface being opposite to the first surface, and
a fine pore formed by the first bottomed hole and the second bottomed hole that partially overlap with each other.

4. The loop heat pipe according to claim 2, wherein
the one or more intermediate metal layers include a plurality of first metal layers as the at least one first metal layer,
each of the plurality of first metal layers includes a second through hole formed in each of the two first porous bodies and extending through the first metal layer in a thickness-wise direction, and
the second through holes in the first metal layers that are in contact with each other partially overlap with each other to form a fine pore.

5. The loop heat pipe according to claim 2, wherein
the one or more intermediate metal layers further include two second metal layers located between the first metal layer and the two outermost metal layers, and
each of the two second metal layers includes
two second wall portions overlapping with the two first wall portions of the first metal layer and forming the two wall portions of the liquid pipe together with the two first wall portions, and
a second porous body located between the two second wall portions, the second porous body being continuous with and formed integrally with the two second wall portions.

6. The loop heat pipe according to claim 2, wherein each of the two outermost metal layers includes a surface that is in contact with one of the intermediate metal layers and a bottomed hole formed in the surface.

7. The loop heat pipe according to claim 1, wherein the liquid pipe includes a post in the flow passage.

8. The loop heat pipe according to claim 7, wherein the post includes a side surface including a groove extending along the flow passage.

9. The loop heat pipe according to claim 1, wherein the liquid pipe further includes a projection obliquely extending from each of the two porous bodies toward a downstream side of the flow passage through which the working fluid flows.

10. A loop heat pipe, comprising:
an evaporator that vaporizes working fluid;
a condenser that liquefies the working fluid vaporized by the evaporator;
a liquid pipe connecting the condenser to the evaporator; and
a vapor pipe connecting the evaporator to the condenser, wherein:
the evaporator, the vapor pipe, the condenser, and the liquid pipe form a looped flow passage through which the working fluid flows, and
the liquid pipe includes
two wall portions located at opposite sides of the liquid pipe,
two porous bodies, each of the two porous bodies being continuous with and formed integrally with one of the two wall portions, and
a flow passage that is a portion of the looped flow passage and located between and completely separating an entirety of the two porous bodies, wherein the two porous bodies are not connected by another porous body.

11. The loop heat pipe according to claim 10, wherein
the liquid pipe includes two outermost metal layers and one or more intermediate metal layers stacked between the two outermost metal layers,
the one or more intermediate metal layers include at least one first metal layer,
the first metal layer includes
two first wall portions forming the two wall portions,
two first porous bodies forming the two porous bodies, each of the two first porous bodies being continuous with and formed integrally with one of the two first wall portions, and
a first through hole extending through the first metal layer in a thickness-wise direction to form the flow passage between the two first porous bodies.

12. The loop heat pipe according to claim 11, wherein each of the two first porous bodies includes
a first bottomed hole recessed from a first surface of the first metal layer,
a second bottomed hole recessed from a second surface of the first metal layer, the second surface being opposite to the first surface, and
a fine pore formed by the first bottomed hole and the second bottomed hole that partially overlap with each other.

13. The loop heat pipe according to claim 11, wherein
the one or more intermediate metal layers include a plurality of first metal layers as the at least one first metal layer,
each of the plurality of first metal layers includes a second through hole formed in each of the two first porous bodies and extending through the first metal layer in a thickness-wise direction, and
the second through holes in the first metal layers that are in contact with each other partially overlap with each other to form a fine pore.

14. The loop heat pipe according to claim 11, wherein
the one or more intermediate metal layers further include two second metal layers located between the first metal layer and the two outermost metal layers, and
each of the two second metal layers includes
two second wall portions overlapping with the two first wall portions of the first metal layer and forming the two wall portions of the liquid pipe together with the two first wall portions, and
a second porous body located between the two second wall portions, the second porous body being continuous with and formed integrally with the two second wall portions.

15. The loop heat pipe according to claim 11, wherein each of the two outermost metal layers includes a surface that is in contact with one of the intermediate metal layers and a bottomed hole formed in the surface.

16. The loop heat pipe according to claim 10, wherein the liquid pipe includes a post in the flow passage.

17. The loop heat pipe according to claim 16, wherein the post includes a side surface including a groove extending along the flow passage.

18. The loop heat pipe according to claim 10, wherein the liquid pipe further includes a projection obliquely extending from each of the two porous bodies toward a downstream side of the flow passage through which the working fluid flows.

19. The loop heat pipe according to claim 1, wherein
the liquid pipe includes two outermost metal layers and one or more intermediate metal layers stacked between the two outermost metal layers,
an upper wall and a lower wall of the flow passage are formed by the two outermost metal layers form, and
a left wall and a right wall of the flow passage are formed by the two porous bodies.

20. The loop heat pipe according to claim 10, wherein
the liquid pipe includes two outermost metal layers and one or more intermediate metal layers stacked between the two outermost metal layers,
an upper wall and a lower wall of the flow passage are formed by the two outermost metal layers form, and
a left wall and a right wall of the flow passage are formed by the two porous bodies.

* * * * *